United States Patent
Doi et al.

(10) Patent No.: US 6,696,180 B2
(45) Date of Patent: Feb. 24, 2004

(54) POLYMERIC FLUORESCENT SUBSTANCE, PRODUCTION METHOD THEREOF, AND POLYMER LIGHT-EMITTING DEVICE USING THE SAME

(75) Inventors: Shuji Doi, Tsukuba (JP); Yoshiaki Tsubata, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/820,946

(22) Filed: Mar. 30, 2001

(65) Prior Publication Data
US 2002/0027623 A1 Mar. 7, 2002

(30) Foreign Application Priority Data
Mar. 31, 2000 (JP) ........................................ 2000-098717

(51) Int. Cl.[7] ........................ H05B 33/00; G02F 1/1335; H01J 1/62
(52) U.S. Cl. ........................ 428/690; 428/917; 349/69; 252/301.35; 313/506
(58) Field of Search ................................ 428/690, 917; 349/69; 252/301.35; 313/506

(56) References Cited

U.S. PATENT DOCUMENTS

| | | | |
|---|---|---|---|
| 5,817,430 A | 10/1998 | Hsieh | 428/690 |
| 5,821,002 A * | 10/1998 | Ohnishi et al. | 428/690 |
| 5,945,502 A | 8/1999 | Hsieh et al. | 528/101 |
| 6,025,462 A | 2/2000 | Wang et al. | 528/377 |
| 2002/0122899 A1 * | 9/2002 | Doi et al. | 428/1.1 |

FOREIGN PATENT DOCUMENTS

| | | |
|---|---|---|
| EP | 0 964 045 A1 | 12/1999 |
| WO | WO 94/20589 | 9/1994 |
| WO | WO 99/21935 | 5/1999 |
| WO | WO 99/21935 A1 | 5/1999 |

OTHER PUBLICATIONS

M. Halim et al., "Conjugated Dendrimers for Light–Emitting Diodes: Effect of Generation", *Adv. Mater.*, vol. 11, No. 5, 1999, pp. 371–374.

Derwent Abstract, Database WPI, Section Ch, Week 200064 corresponding to JP 2000–239360.

\* cited by examiner

*Primary Examiner*—Cynthia H. Kelly
*Assistant Examiner*—Dawn Garrett
(74) *Attorney, Agent, or Firm*—Sughrue Mion, PLLC

(57) ABSTRACT

Provided is a polymeric fluorescent substance containing specific repeating units at a specific ratio in main chain and having a branching polymeric chain. The substance is excellent in film-forming property without losing solubility in a solvent, and preferably used for a polymer LED having high light-emitting efficiency.

44 Claims, No Drawings

POLYMERIC FLUORESCENT SUBSTANCE, PRODUCTION METHOD THEREOF, AND POLYMER LIGHT-EMITTING DEVICE USING THE SAME

BACKGROUND OF THE INVENTION

FIELD OF THE INVENTION

The present invention relates to a polymeric fluorescent substance, a method for producing the same, a polymer light-emitting device (hereinafter, sometimes referred to as polymer LED) using the same.

Inorganic electroluminescence devices (hereinafter, sometimes referred to as inorganic EL device) using an inorganic luminescent material as a light emitting material are used for example for flat light sources as back-lights and displays such as a flat panel display and the like, however, an alternating current of high voltage has been required for light emission.

Recently, Tang et al. fabricated an organic electroluminescence device (hereinafter, sometimes referred to as organic EL device) having a double-layer structure in which an organic fluorescent dye as a light emitting layer is laminated with an organic charge transport compound used in photosensitive layer for electrophotography and the like (Japanese Patent Application Laid-Open (JP-A) No. 59-194393). Since organic EL devices have characteristics that light emissions of a lot of colors are obtained easily in addition to low voltage driving and high luminance as compared with inorganic EL devices, there have been reported a lot of trials regarding device structures, organic fluorescent dyes and organic charge transport compounds of organic EL devices [Jpn. J. Appl. Phys., 27, L269 (1988), J. Appl. Phys., 65, 3610 (1989)].

Further, apart from organic EL devices using mainly organic compounds having a lower molecular weight, polymer light emitting devices (hereinafter, sometimes referred to as polymer LEDs) using light emitting materials having a higher molecular weight have been proposed in such as WO 9013148 published specification, JP-A No. 3-244630, Appl. Phys. Lett., 58, 1982 (1991). WO9013148 discloses in the Examples an EL device using a thin film of poly(p-phenylene vinylene) obtained by forming a film of a soluble precursor on the electrode and subjecting it to a heat treatment to convert the precursor into a conjugated polymer.

Further, JP-A 3-244630 has exemplified a conjugated polymers having a feature that they are themselves soluble in a solvent and needs no heat treatment. Also in Appl. Phys. Lett., 58, 1982 (1991), a polymeric light emitting materials soluble in a solvent and a polymer LED fabricated using the same are described.

As the polymeric fluorescent substance used in these polymer LEDs, polyfluorenes (Japanese Journal of Applied Physics, 30, L1941 (1991)), poly(p-phenylene) derivatives (Advanced Materials, 4, 36 (1992)) and the like are also disclosed, in addition to the above-mentioned poly(p-phenylene vinylene).
(0005)

As described above, in a polymer LED, a light-emitting layer can be easily formed by application using a polymeric fluorescent substance soluble in a solvent, therefore, the LED has a feature that it is advantageous for large area and low cost as compared with vapor deposition of a fluorescent substance having lower molecular weight. For utilizing this feature, there are requirements for a polymeric fluorescent substance further having excellent light-emitting efficiency when used in a light-emitting layer of a polymer LED, while maintaining excellent solubility and film-forming ability, a method for producing the same, and a polymer LED having high light-emitting efficiency using the same.

The object of the present invention is to provide a polymeric fluorescent substance further having excellent light-emitting efficiency when used in a light-emitting layer of a polymer LED, while maintaining excellent solubility and film-forming ability, a method for producing the polymeric fluorescent substance, and a polymer LED having high light-emitting efficiency using the polymeric fluorescent substance.

SUMMARY OF THE INVENTION

The present inventors have intensively investigated in view of such circumstances, and resultantly found that a polymeric fluorescent substance containing specific repeating units at a specific ratio in the main chain and having a branching polymeric chain satisfies also excellent film-forming ability simultaneously without losing solubility in a solvent, that this polymeric fluorescent substance can be produced by reacting specific compounds at a specific ratio, and that a polymer LED having high light-emitting efficiency can be obtained by using this polymeric fluorescent substance, leading to completion of the present invention.

Namely, the present invention related to:

[1] A polymeric fluorescent substance which emits fluorescence in solid state, has a polystyrene-reduced number-average molecular weight of $10^3$ to $10^8$ and contains one or more repeating units represented by the following formula (1) in main chain, wherein 0.05 to 10 mol % repeating units of all repeating units contained in the polymeric fluorescent substance have branching polymeric chains:

(1)

In the formula, $Ar_1$ is a group selected from the group consisting of an arylene group having 6 to 60 carbon atoms, a heterocyclic compound group having 4 to 60 carbon atoms and a group containing a metal complex having, as a ligand, one or more organic compounds containing 4 to 60 carbon atoms; $Ar_1$ may have one or more substituents; each of $R_1$ and $R_2$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and n is 0 or 1.

[2] The polymeric fluorescent substance according to [1], wherein the substances contains each one or more of repeating units represented by the formula (1) and the following formula (2) in main chain, and the total amount of these repeating units is 50 mol % or more based on the amount of all repeating units, the amount of repeating units of the formula (2) is 0.1 to 10 mol % based on the total amount of repeating units of the formulae (1) and (2), and the substance has a polymeric chain which is branched at a repeating unit of the formula (2) as a branching point:

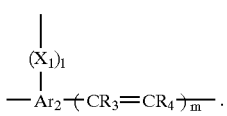
(2)

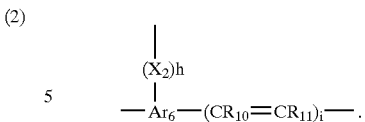
(5)

In the formula, $Ar_2$ is an arylene group having 6 to 60 carbon atoms or a heterocyclic compound group having 4 to 60 carbon atoms; $X_1$ is a group of the following formula (3), and constitutes apart of the main chain; the symbol "1" is an integer of 1 to 4. $Ar_2$ may further have one or more substituents; when $Ar_2$ has a plurality of substituents, they may be the same or different; each of $R_3$ and $R_4$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and m is 0 or 1:

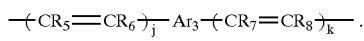
(3)

In the formula, $Ar_3$ is an arylene group having 6 to 60 carbon atoms or a heterocyclic compound group having 4 to 60 carbon atoms; $Ar_3$ may have one or more substituents; each of $R_5$, $R_6$, $R_7$ and $R_8$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and each of j and k is independently 0 or 1.

[3] The polymeric fluorescent substance according to [1], wherein the substance contains each one or more of repeating units of said formula (1) and the following formula (4) in main chain, and the total amount of these repeating units is 50 mol % or more based on the amount of all repeating units, the amount of repeating units of the formula (4) is 0.1 to 10 mol % based on the total amount of repeating units of the formulae (1) and (4), and the substance has a polymeric chain which is branched at a repeating unit of the formula (4) as a branching point.

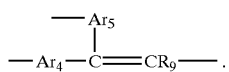
(4)

In the formula, $Ar_4$ and $Ar_5$ are an arylene group having 6 to 60 carbon atoms or a heterocyclic compound group having 4 to 60 carbon atoms; $Ar_4$ and $Ar_5$ may have one or more substituents. $R_9$ represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

[4] The polymeric fluorescent substance according to [1], wherein the substance contains each one or more of repeating units of said formula (1) and the following formula (5) in main chain, and the total amount of these repeating units is 50 mol % or more based on the amount of all repeating units, the amount of repeating units of the formula (5) is 0.1 to 10 mol % based on the total amount of repeating units of the formulae (1) and (5), and the substance has a polymeric chain which is branched at a repeating unit of the formula (5) as a branching point.

In the formula, $Ar_6$ is a group containing a metal complex having as a ligand an organic compound containing 4 to 60 carbon atoms; said metal complex has two or more ligands connected with the adjacent repeating units, and constitutes a branching point being connected with three or more adjacent repeating units as the whole metal complex; $X_2$ is a group of the following formula (6), and constitutes a part of the polymeric chain; h is an integer of 1 to 4; $Ar_6$ may further have one or more substituents; when $Ar_6$ has a plurality of substituents, they may be the same or different; each of $R_{10}$ and $R_{11}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and i is 0 or 1,

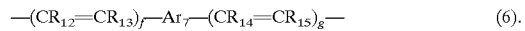
(6).

In the formula, $Ar_7$ is an arylene group having 6 to 60 carbon atoms contained in the polymeric chain or a heterocyclic compound group having 4 to 60 carbon atoms contained in the polymeric chain; $Ar_7$ may have one or more substituents; each of $R_{12}$, $R_{13}$, $R_{14}$ and $R_{15}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and each of g and f is independently 0 or 1.

[5] A method for producing the polymeric fluorescent substance of [1], [2] or [4], which comprises reacting each one or more compounds of the following formulae (7), (8) and (9) so that the amount of compounds of the following formula (9) is in a range from 0.05 to 10 mol % based on the total amount of compounds of the following formulae (7), (8) and (9).

(7)

(8)

(9)

In the formulae, each of $Ar_8$ to $Ar_{10}$ independently represents a group selected from the group consisting of aromatic hydrocarbon groups having 6 to 60 carbon atoms, heterocyclic compound groups having 4 to 60 carbon atoms and groups containing a metal complex having as a ligand an organic compound containing 4 to 60 carbon atoms; $Ar_8$ to $Ar_{10}$ may have one or more substituents; $X_3$ and $X_4$ are reactive substituents which mutually react to form a carbon—carbon single bond or a structure of the following formula (10); $X_3$ and $X_4$ represent different groups from each other; and a represents an integer of 3 to 6,

(10).

In the formula, each of $R_{16}$ and $R_{17}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

[6] A method for producing the polymeric fluorescent substance of [1], [2] or [4], which comprises reacting each one or more compounds of the following formulae (11), (12) and (13) so that the amount of compounds of the following formula (12) is in a range from 90 to 99.95 mol % based on the total amount of compounds of the following formulae (11), (12) and (13).

$$Ar_{11}-(X_5)_b \quad (11)$$

$$X_6-Ar_{12}-X_6 \quad (12)$$

$$X_6-Ar_{13}-(X_5)_c \quad (13).$$

In the formulae, each of $Ar_{11}$ to $Ar_{13}$ independently represents a group selected from the group consisting of aromatic hydrocarbon groups having 6 to 60 carbon atoms, heterocyclic compound groups having 4 to 60 carbon atoms and groups containing a metal complex having as a ligand an organic compound containing 4 to 60 carbon atoms; each of $Ar_{11}$ to $Ar_{13}$ independently may have substituents; $X_5$ and $X_6$ are reactive substituents which mutually react to form a carbon—carbon single bond or a structure of said formula (10); $X_5$ and $X_6$ represent different groups from each other; b represents an integer of 3 to 6; and c represents an integer of 2 to 5.

[7] A method for producing the polymeric fluorescent substance of [1], [2] or [4], which comprises reacting each one or more compounds of said formulae (11) and (12) so that the amount of compounds of the formula (11) is in a range from 0.05 to 10 mol % based on the total amount of compounds of the formulae (11) and (12).

[8] A method for producing the polymeric fluorescent substance of [1] or [3], which comprises reacting each one or more compounds of the following formulae (14) and (15) with one or more compounds of the following formulae (16), (17) and (18) to obtain a polymeric fluorescent substance so that the total amount of compounds of the following formulae (14) and (15) is in a range from 0.05 to 10 mol % based on the total amount of compounds of the following formulae (14), (15), (16), (17) and (18).

$$X_7-Ar_{14}-X_7 \quad (14)$$

$$X_7-Ar_{14}-X_7 \quad (14)$$

$$X_8-Ar_{15}-X_8 \quad (15)$$

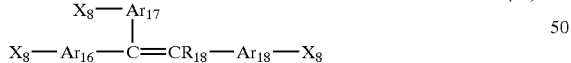

(16)

(17)

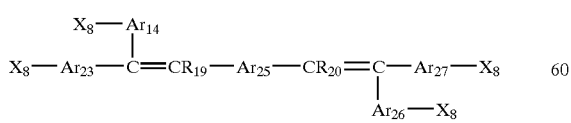

(18)

In the formulae, each of $Ar_{14}$ to $Ar_{27}$ independently represents a group selected from the group consisting of aromatic hydrocarbon groups having 6 to 60 carbon atoms, heterocyclic compound groups having 4 to 60 carbon atoms and groups containing a metal complex having as a ligand an organic compound containing 4 to 60 carbon atoms; each of $Ar_{14}$ to $Ar_{27}$ independently may have one or more substituents; $X_7$ and $X_8$ are reactive substituents which mutually react to form a carbon—carbon single bond or a structure of said formula (10); $X_7$ and $X_8$ represent different groups from each other; and each of $R_{18}$ to $R_{20}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

[9] A polymer light emitting device comprising a pair of electrodes composed of an anode and a cathode at least one of which is transparent or semitransparent and at least one light emitting layer disposed between the electrodes, wherein the polymeric fluorescent substance of any of [1] to [4] is contained in said light emitting layer.

[10] The polymer light emitting device according to [9] wherein a layer containing an conducting polymer is disposed at least between one electrode and the light emitting layer so that the layer containing an conducting polymer is adjacent to said electrode.

[11] The polymer light emitting device according to [9] wherein an insulation layer having a thickness of 2 nm or less is disposed at least between one electrode and the light emitting layer so that the insulation layer is adjacent to said electrode.

[12] The polymer light emitting device according to any of [9] to [11] wherein a layer comprising an electron transporting compound is disposed between the cathode and the light emitting layer so that the layer comprising an electron transporting compound is adjacent to said light emitting layer.

[13] The polymer light emitting device according to any of [9] to [11] wherein a layer comprising a hole transporting compound is disposed between the anode and the light emitting layer so that the layer comprising a hole transporting compound is adjacent to said light emitting layer.

[14] The polymer light emitting device according to any of [9] to [11] wherein a layer comprising an electron transporting compound is disposed between the cathode and the light emitting layer so that the layer comprising an electron transporting compound is adjacent to said light emitting layer, and a layer comprising a hole transporting compound is disposed between the anode and the light emitting layer so that the layer comprising a hole transporting compound is adjacent to said light emitting layer.

[15] A flat light source obtained by using the polymer light emitting device of any of [9] to [14].

[16] A segment display obtained by using the polymer light emitting device of any of [9] to [14].

[17] A dot matrix display obtained by using the polymer light emitting device of any of [9] to [14].

[18] A liquid crystal display obtained by using the polymer light emitting device of any of [9] to [14] as a back-light.

DETAILED DESCRIPTION OF THE INVENTION

The polymeric fluorescent substance of the present invention, a method for producing the polymeric fluorescent substance, and a polymer LED obtained by using the polymeric fluorescent substance will be described in detail below.

The polymeric fluorescent substance of the present invention emits fluorescence in solid state, has a polystyrene-reduced number-average molecular weight of $10^3$ to $10^8$ and contains one or more repeating units represented by the above-mentioned formula (1), and characterized in that 0.05 to 10 mol % repeating units of all repeating units contained in the polymeric fluorescent substance have branching polymeric chain. Here, the main chain means a molecular chain constituting a skeleton structure of the polymer compound. Depending on the structure of repeating units and number of branching, the amount of repeating units for a branching polymeric chain is more preferably from 0.1 to 10 mol %, further preferably from 0.1 to 5 mol % based on the amount of all repeating units, providing solubility and film-forming ability can be maintained.

As the structure of a branching point, arylene groups or heterocyclic compound groups represented by $Ar_2$ in the above-mentioned formula (2), vinylene groups of the above-mentioned formula (4), and groups containing a metal complex represented by $Ar_6$ in the above-mentioned formula (5) are preferable. Two or more of these branching points may be used in combination. Further, when these branching points are contained, each one or more of repeating units containing these branching points and repeating units of the above-mentioned formula (1) are contained, the total amount of these repeating units is 50 mol % or more based on the amount of all repeating units, and the amount of repeating units containing the branching point is from 0.1 to 10 mol % based on the total amount of repeating units containing the branching point and repeating units of the formula (1). Depending on the structure of repeating units and number of branching, it is more preferably from 0.1 to 5 mol %, further preferably from 0.2 to 5 mol %, providing solubility and film-forming ability can be maintained.

The branching point may also have the other structure than the above-mentioned preferable structures providing the amount of the repeating units for a branching polymeric chain is within the condition in the instant application, however, preferable is a form in which a conjugated bond in the main chain is not disconnected.

Branching of the main chain and film-forming ability are related with each other, and when appropriate branches are present, film quality is improved and excellent light-emitting efficiency is achieved when used in a light-emitting layer of a polymer LED, while when too much branches are present, a polymer in the form of a network is obtained, leading to reduction in solubility.

In the above-mentioned formula (1), $Ar_1$ is a group selected from the group consisting of arylene groups having 6 to 60 carbon atoms contained in the main chain, heterocyclic compound groups having 4 to 60 carbon atoms contained in the main chain and groups containing a metal complex having as a ligand an organic compound containing 4 to 60 carbon atoms. These may be unsubstituted or substituted.

Each of $Ar_2$ in the above-mentioned formula (2), $Ar_3$ in the above-mentioned formula (3), $Ar_4$, $Ar_5$ in the above-mentioned formula (4), and $Ar_6$ in the above-mentioned formula (5) independently represents an arylene group having 6 to 60 carbon atoms in the main chain or a heterocyclic compound group having 4 to 60 carbon atoms contained in the main chain, and may be unsubstituted or substituted.

Further, $Ar_6$ in the above-mentioned formula (5) is a group selected from groups containing a metal complex having as a ligand an organic compound having 4 to 60 carbon atoms, and may be unsubstituted or substituted.

$Ar_1$ to $Ar_7$ may be advantageously selected so as not to lose the fluorescent property of a polymeric fluorescent substance, and specific examples thereof include arylene groups or heterocyclic compound groups exemplified in the following chemical formulae 37 to 50, or groups containing a metal complex exemplified in the following chemical formula 51.

Chemical formula 37

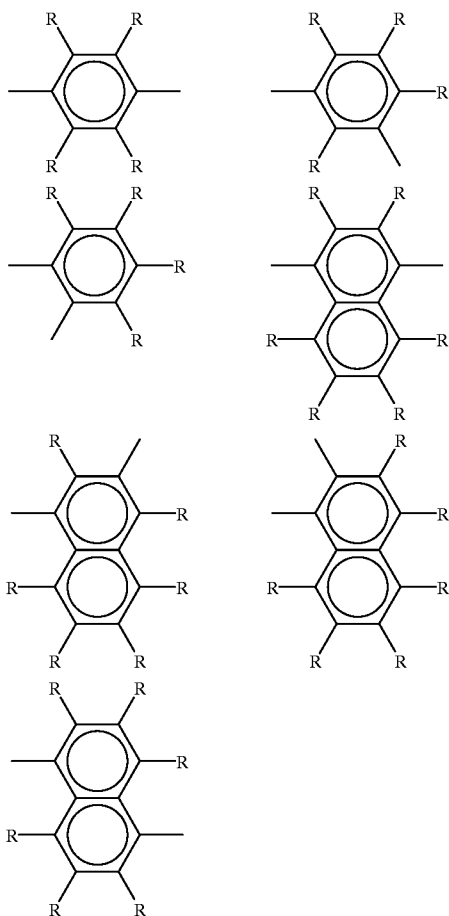

Chemical formula 38

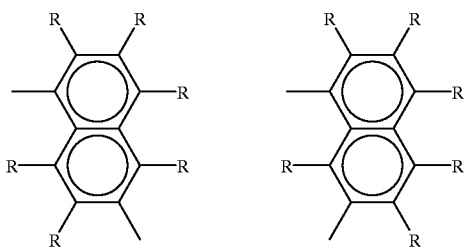

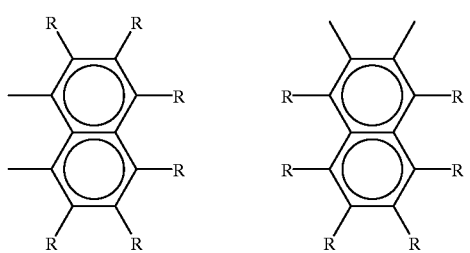
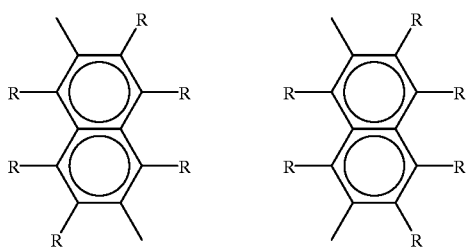
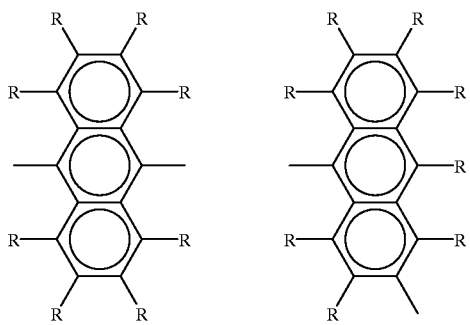
Chemical formula 39
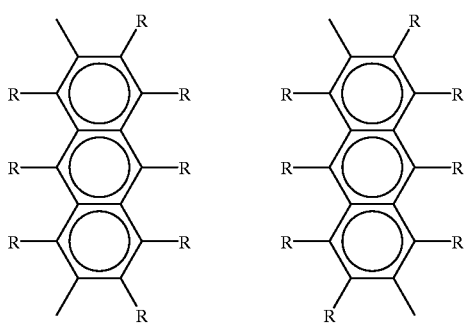
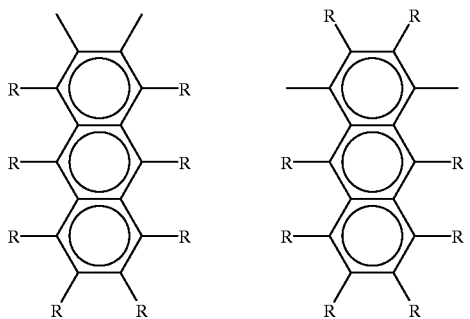
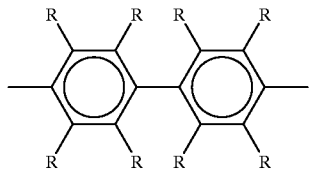
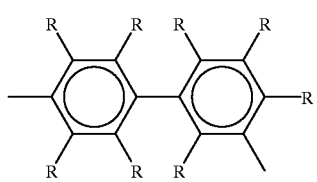
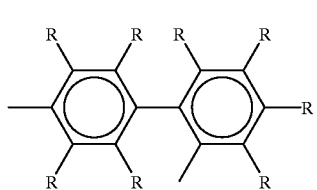
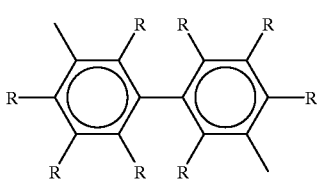
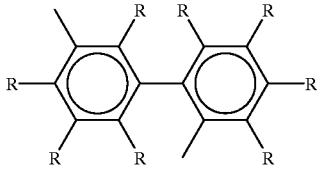
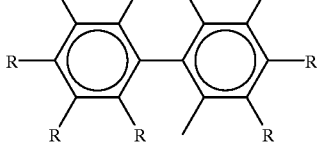
Chemical formula 40
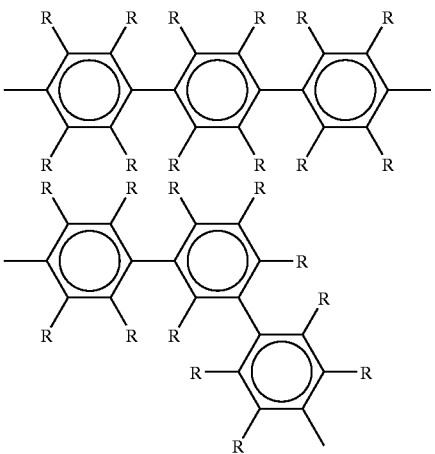

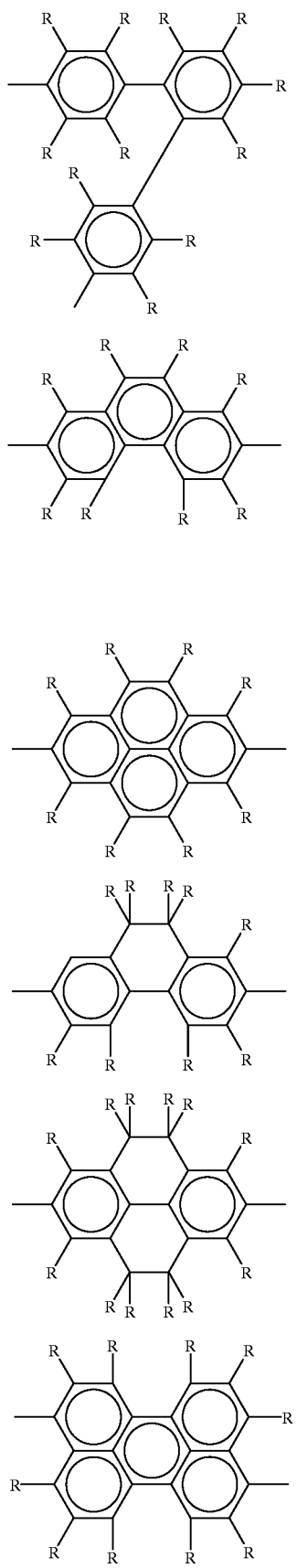
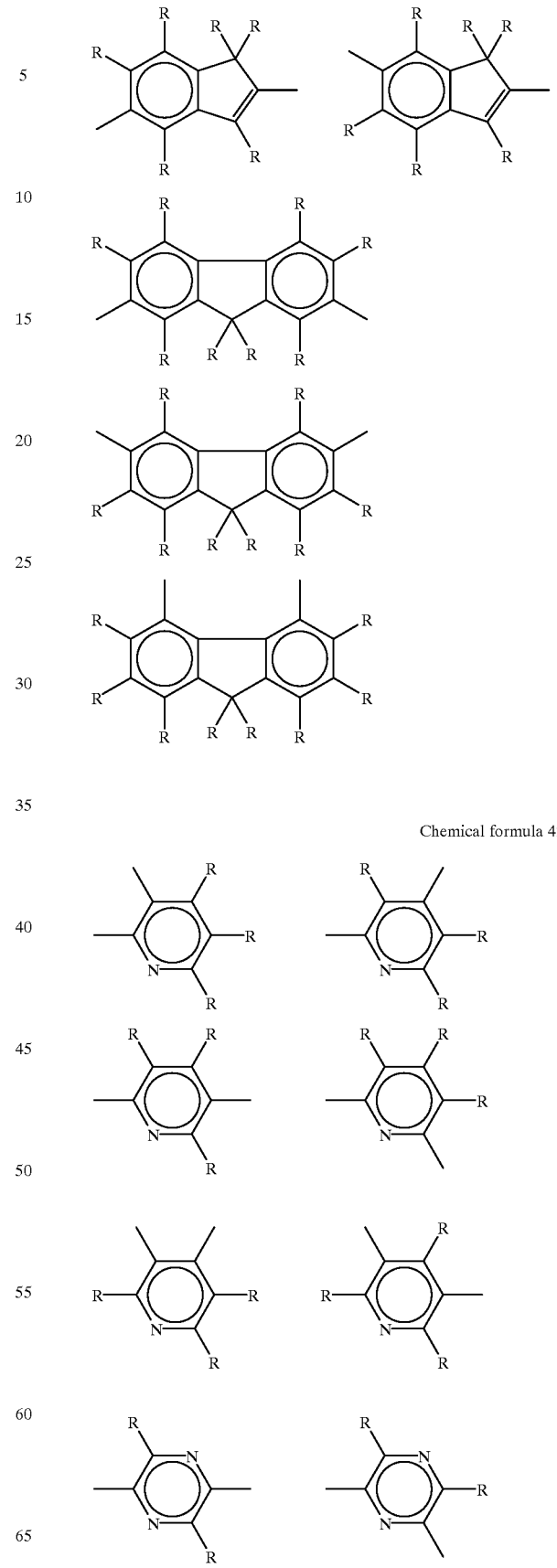
Chemical formula 41
Chemical formula 42

-continued
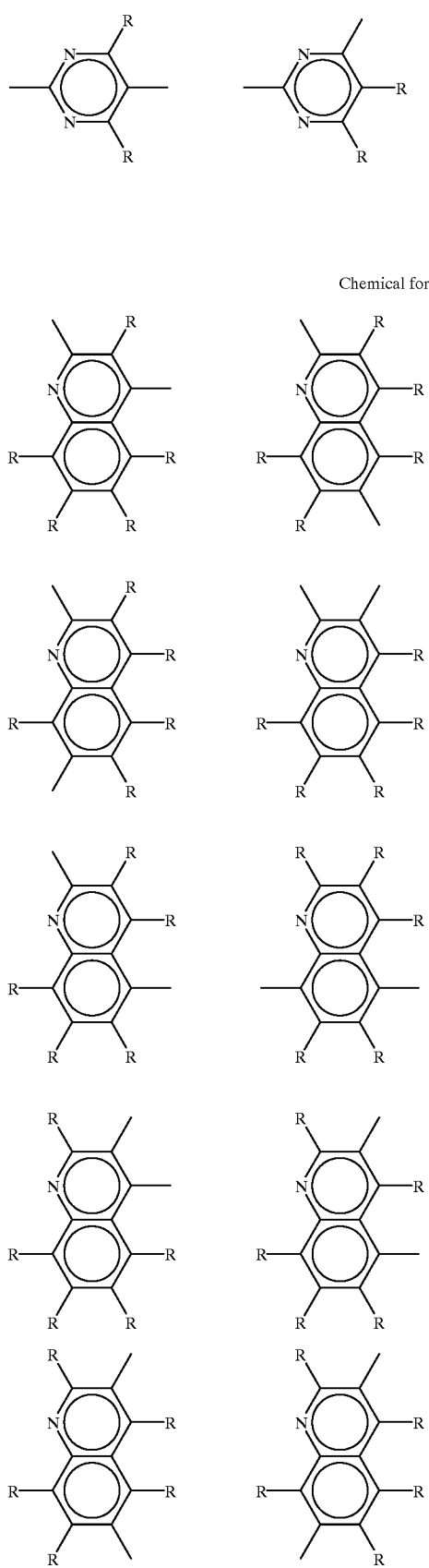
Chemical formula 43
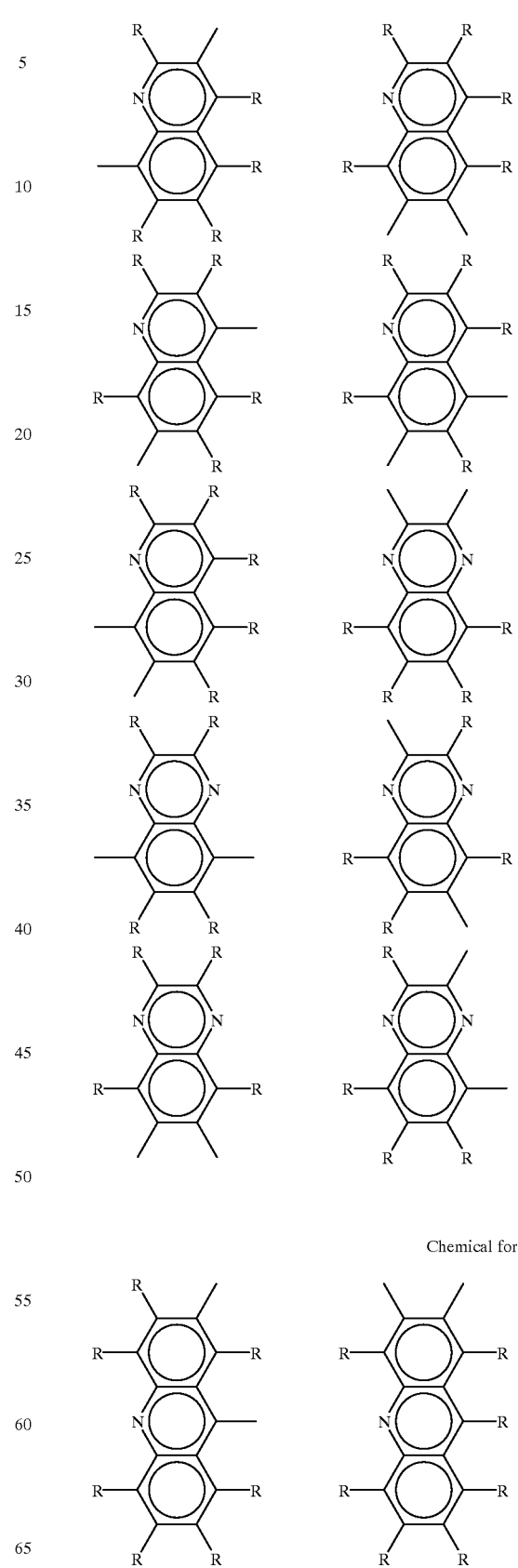
Chemical formula 44
Chemical formula 45
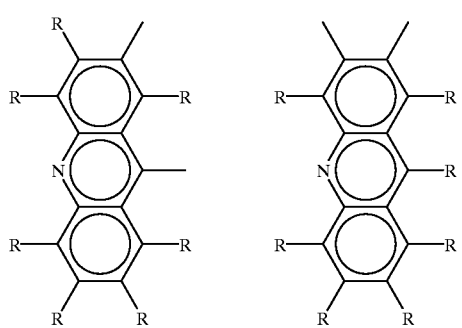

-continued
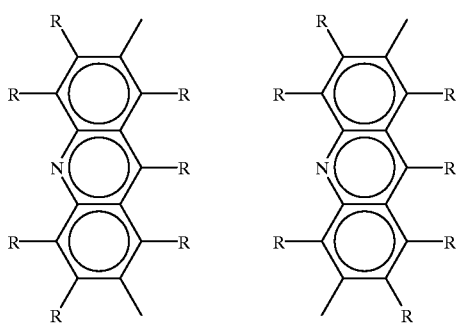
Chemical formula 46
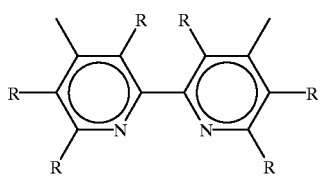
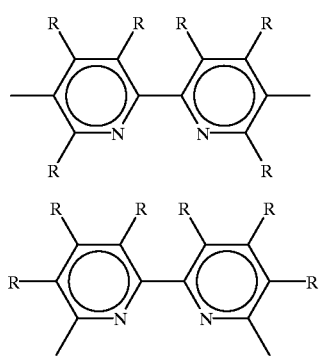
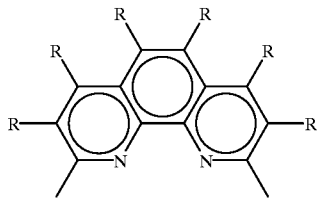
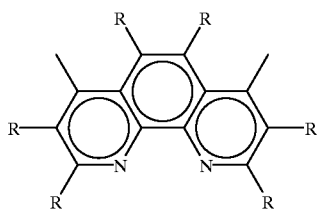
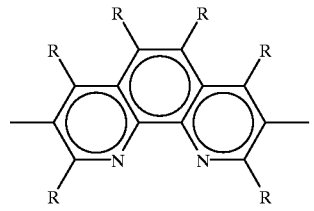
Chemical formula 47
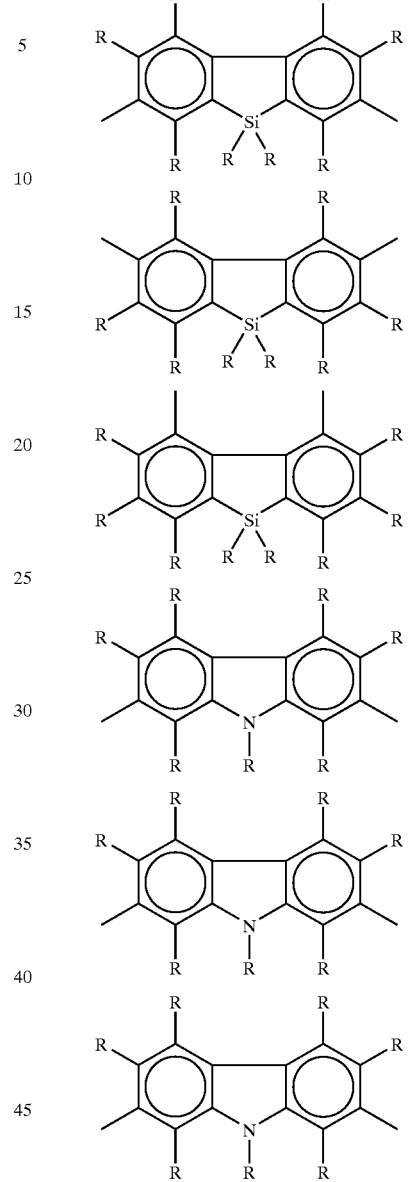
Chemical formula 48
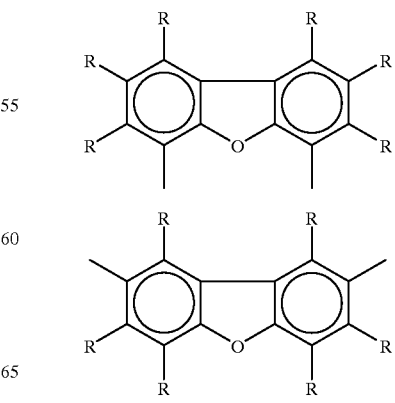

-continued
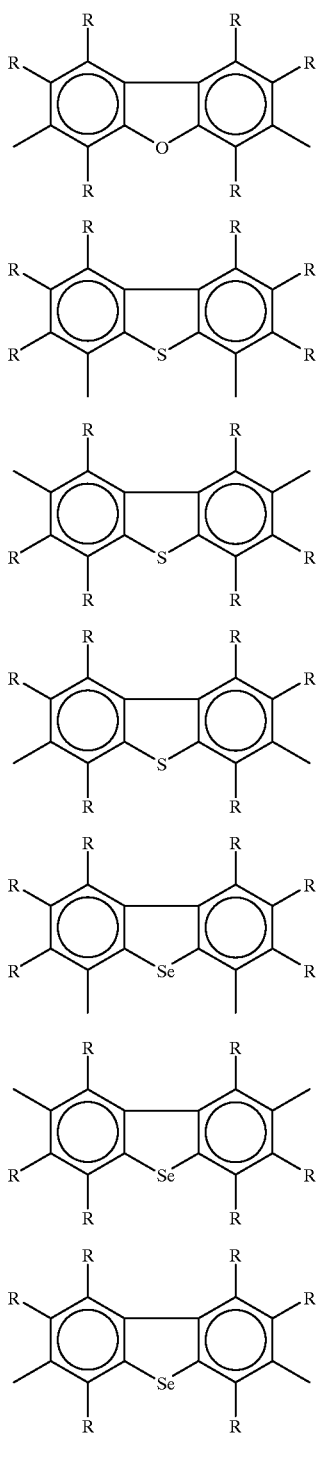
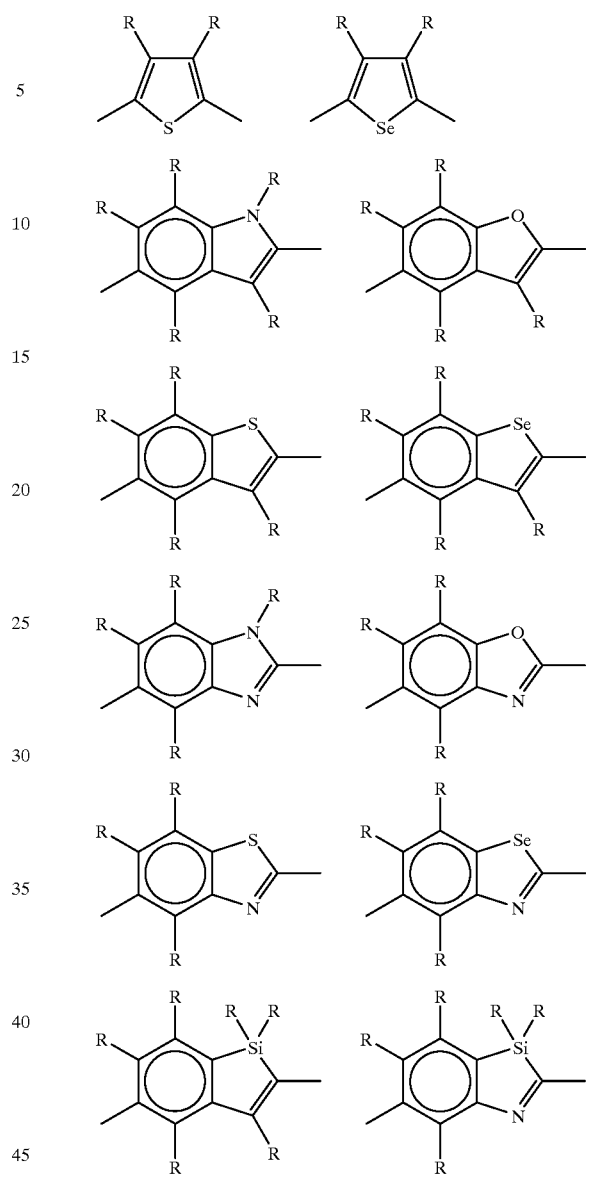
Chemical formula 49
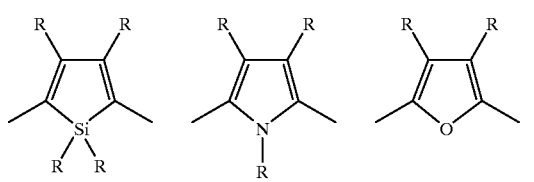
Chemical formula 50
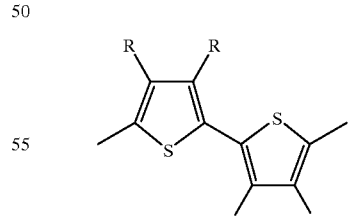
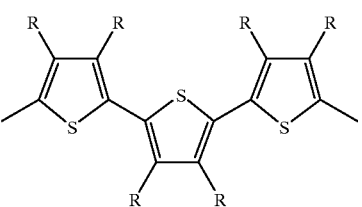

-continued
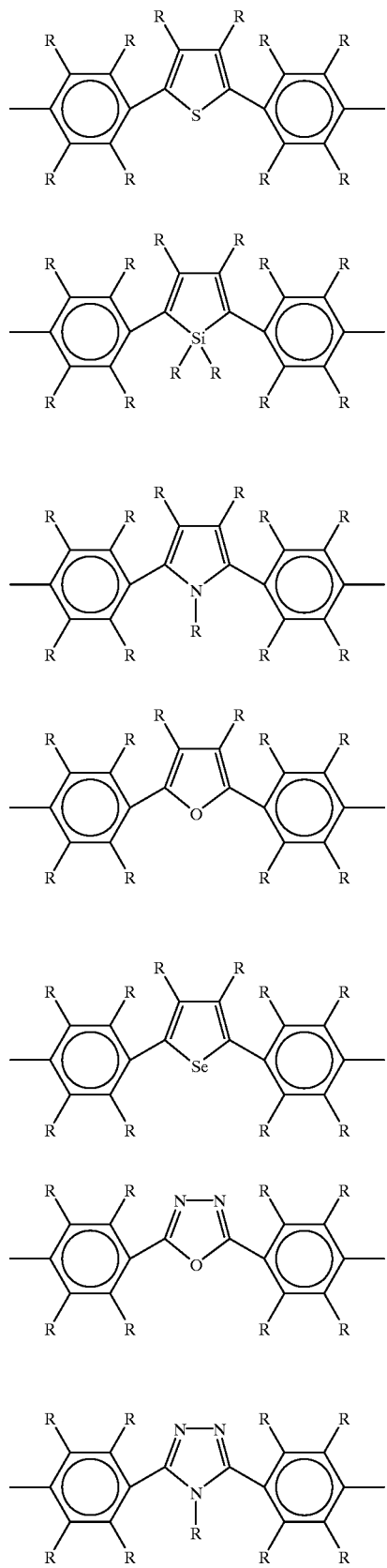
Chemical formula 51
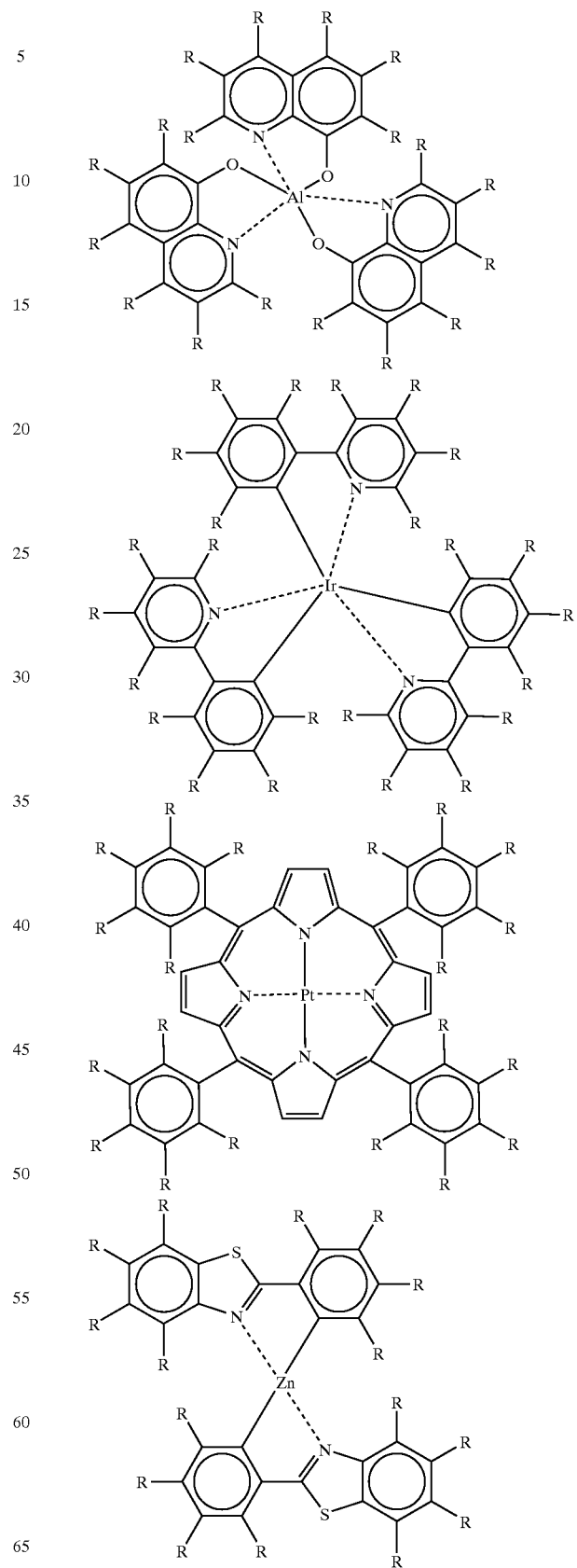

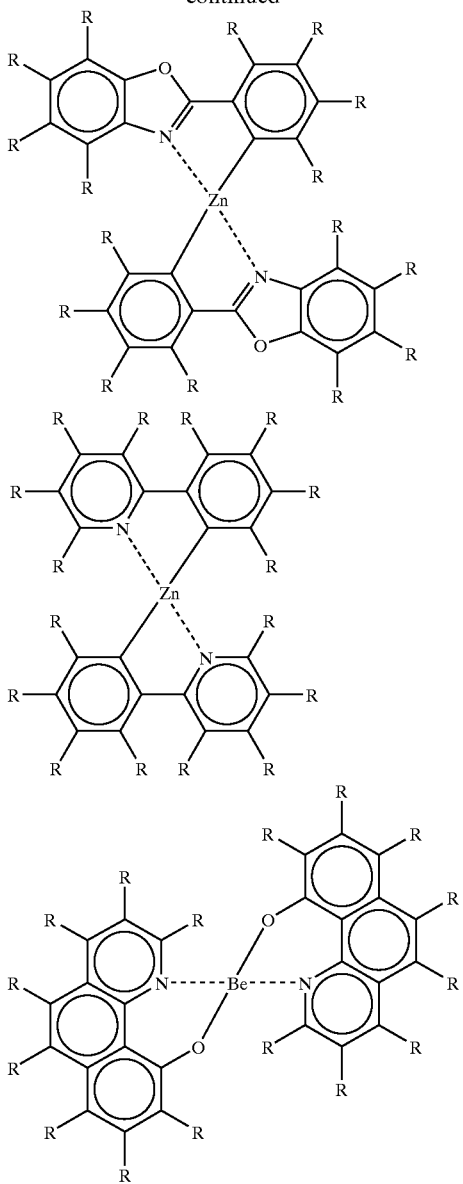

In the above formulae, R represents a hydrogen atom or a substituent, and if necessary, a connecting group with the adjacent repeating units. Namely, in the case of $Ar_3$, one to four Rs are substituents of the above-mentioned formula (3), while in the case of $Ar_6$, one to four Rs are substituents of the above-mentioned formula (6). When Rs are other than a hydrogen atom, groups selected from the group consisting of alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylalkyl groups having 7 to 60 carbon atoms, arylalkoxy groups having 7 to 60 carbon atoms, arylalkenyl groups having 8 to 60 carbon atoms, arylalkynyl groups having 8 to 60 carbon atoms, arylamino groups having 6 to 60 carbon atoms, heterocyclic compound groups having 4 to 60 carbon atoms and a cyano group, are exemplified, each independently. In the above-mentioned examples, a plurality of Rs are present in one structural formula, and they may be the same or different, and they are selected independently each other. When $Ar_1$ to $Ar_7$ each has a plurality of substituents, they may be the same or different each other. For enhancing the solubility into a solvent, it is preferable that there is at least one substituent other than a hydrogen atom, and it is preferable that the symmetric property of the form of a repeating unit including a substituent is low.

When R represents other than a hydrogen atom and a cyano group, regarding specific substituents, examples of the alkyl groups of 1 to 20 carbon atoms include a methyl group, ethyl group, propyl group, butyl group, pentyl group, hexyl group, heptyl group, octyl group, nonyl group, decyl group, lauryl group and the like, and a pentyl group, hexyl group, octyl group and decyl group are preferable. Included in examples of the alkyl groups of 5 to 20 carbon atoms are a pentyl group, hexyl group, heptyl group, octyl group, nonyl group, decyl group, lauryl group and the like, and a pentyl group, hexyl group, octyl group and decyl group are preferable.

Given as examples of the alkoxy groups of 1 to 20 carbon atoms are a methoxy group, ethoxy group, propyloxy group, butoxy group, pentyloxy group, hexyloxy group, heptyloxy group, octyloxy group, nonyloxy group, decyloxy group, lauryloxy group and the like and a pentyloxy group, hexyloxy group, octyloxy group and decyloxyl group are preferable. Included in examples of the alkoxy groups of 5 to 20 carbon atoms are a pentyloxy group, hexyloxy group, heptyloxy group, octyloxy group, nonyloxy group, decyloxy group, lauryloxy group and the like, and a pentyloxy group, hexyloxy group, octyloxy group and decyloxy group are preferable.

Examples of the alkylthio groups of 1 to 20 carbon atoms include a methylthio group, ethylthio group, propylthio group, butylthio group, pentylthio group, hexylthio group, heptylthio group, octylthio group, nonylthio group, decylthio group, laurylthio group and the like, and a pentylthio group, hexylthio group, octylthio group and decylthio group are preferable. Included in examples of the alkylthio group of 5 to 20 carbon atoms are a pentylthio group, hexylthio group, heptylthio group, octylthio group, nonylthio group, decylthio group, laurylthio group and the like, and a pentylthio group, hexylthio group, octylthio group and decylthio group are preferable.

Examples of the alkylsilyl group of 1 to 60 carbon atoms include a methylsilyl group, ethylsilyl group, propylsilyl group, butylsilyl group, pentylsilyl group, hexylsilyl group, heptylsilyl group, octylsilyl group, nonylsilyl group, decylsilyl group, laurylsilyl group, trimethylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like, and a pentylsilyl group, hexylsilyl group, octylsilyl group, decylsilyl group, pentyldimethylsilyl group, hexyldimethylsilyl group, octyldimethylsilyl group and decyldimethylsilyl group are preferable. Given as examples of the alkylsilyl group of 5 to 60 carbon atoms are a triethylsilyl group, tripropylsilyl group, tributylsilyl group, tripentylsilyl group, trihexylsilyl group, triheptylsilyl group, trioctylsilyl group, trinonylsilyl group, tridecylsilyl group, trilaurylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like, and a tripentylsilyl group, trihexylsilyl group, trioctylsilyl group, tridecylsilyl group, pentyldimethylsilyl group, hexyldimethylsilyl group, octyldimethylsilyl group and decyldimethylsilyl group are preferable.

Examples of the alkylamino groups of 1 to 40 carbon atoms include a methylamino group, dimethylamino group, ethylamino group, propylamino group, butylamino group, pentylamino group, hexylamino group, heptylamino group, octylamino group, nonylamino group, decylamino group, laurylamino group and the like, and a pentylamino group, hexylamino group, octylamino groupanddecylaminogroupareprefeгable. Includedinexamples of the alkylamino groups of 5 to 40 carbon atoms are a pentylamino group, hexylamino group, heptylamino group, octylamino group, nonylamino group, decylamino group, laurylamino group, dipropylamino group, dibutylamino group, dipentylamino group, dihexylamino group, diheptylamino group, dioctylamino group, dinonylamino group, didecylamino group, dilaurylamino group and the like, and a pentylamino group, hexylamino group, octylamino group, decylamino group, dipentylamino group, dihexylamino group, dioctylamino group and didecylamino group are preferable.

Examples of the aryl groups of 6 to 60 carbon atoms include a phenyl group, $C_1$ to $C_{12}$ alkoxyphenyl groups ($C_1$ to $C_{12}$ indicates 1 to 12 carbon atoms: hereinafter the same), $C_1$ to $C_{12}$ alkylphenyl groups, 1-naphthyl group, 2-naphthyl group and the like, and $C_1$ to $C_{12}$ alkoxyphenyl groups and $C_1$ to $C_{12}$ alkylphenyl groups are preferable.

Examples of the aryloxy groups of 6 to 60 carbon atoms include a phenoxy group, $C_1$ to $C_{12}$ alkoxyphenoxy groups, $C_1$ to $C_{12}$ alkylphenoxy groups, 1-naphthyloxy group, 2-naphthyloxy group and the like, and $C_1$ to $C_{12}$ alkoxyphenoxy groups and $C_1$ to $C_{12}$ alkylphenoxy groups are preferable.

Examples of the arylalkyl groups of 7 to 60 carbon atoms include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups are preferable. More specific examples thereof include a phenylmethyl group, phenylethyl group, phenylpropyl group, $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group, $C_1$ to $C_{12}$ alkylphenylpropyl group, naphthylmethyl group, naphthylethyl group, naphthylpropyl group and the like, and $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group and $C_1$ to $C_{12}$ alkylphenylpropyl group are preferable.

Examples of the arylalkoxy groups of 7 to 60 carbon atoms include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups are preferable. More specific examples thereof include a phenylmethoxy group, phenylethoxy group, phenylpropyloxy group, $C_1$ to $C_{12}$ alkoxyphenylmethoxy group, $C_1$ to $C_{12}$ alkoxyphenylethoxy group, $C_1$ to $C_{12}$ alkoxyphenylpropyloxy group, $C_1$ to $C_{12}$ alkylphenylmethoxy group, $C_1$ to $C_{12}$ alkylphenylethoxy group, $C_1$ to $C_{12}$ alkylphenylpropyloxy group, naphthylmethoxy group, naphthylethoxy group, naphthylpropyloxy group and the like, and $C_1$ to $C_{12}$ alkoxyphenylmethoxy group, $C_1$ to $C_{12}$ alkoxyphenylethoxy group, $C_1$ to $C_{12}$ alkoxyphenylpropyloxy group, $C_1$ to $C_{12}$ alkylphenylmethoxy group, $C_1$ to $C_{12}$ alkylphenylethoxy group and $C_1$ to $C_{12}$ alkylphenylpropyloxy group are preferable.

Examples of the arylalkenyl groups of 6 to 60 carbon atoms include a phenylethenyl group, $C_1$ to $C_{12}$ alkoxyphenylethenyl groups, $C_1$ to $C_{12}$ alkylphenylethenyl groups, naphthylethenyl group, anthrylethenyl group, pyrenylethenyl group and the like, and $C_1$ to $C_{12}$ alkoxyphenylethenyl groups and $C_1$ to $C_{12}$ alkylphenylethenyl groups are preferable.

Examples of the arylalkynyl groups of 6 to 60 carbon atoms include a phenylethynyl group, $C_1$ to $C_{12}$ alkoxyphenylethynyl groups, $C_1$ to $C_{12}$ alkylphenylethynyl groups, naphthylethynyl group, anthrylethynyl group, pyrenylethynyl group and the like, and $C_1$ to $C_{12}$ alkoxyphenylethynyl groups and $C_1$ to $C_{12}$ alkylphenylethynyl groups are preferable.

Examples of the arylamino groups of 7 to 60 carbon atoms include a phenylamino group, diphenylamino group, $C_1$ to $C_{12}$ alkoxyphenylamino groups, bis($C_1$ to $C_{12}$ alkoxyphenyl)amino groups, bis($C_1$ to $C_{12}$ alkylphenyl) amino groups, 1-naphthylamino group, 2-naphthylamino group and the like, and $C_1$ to $C_{12}$ alkoxyphenylamino groups and bis($C_1$ to $C_{12}$ alkoxyphenyl)amino groups are preferable.

Examples of the heterocyclic compound groups of 4 to 60 carbon atoms include a thienyl group, $C_1$ to $C_{12}$ alkylthienyl groups, pyrrolyl group, furyl group, pyridyl group, $C_1$ to $C_{12}$ alkylpyridyl groups and the like, and a thienyl group, $C_1$ to $C_{12}$ alkylthienyl groups, pyridyl group and $C_1$ to $C_{12}$ alkylpyridyl groups are preferable.

Regarding substituents containing an alkyl group among examples of R, they may be any or linear, branched or cyclic or combination thereof, and when not linear, there are exemplified an isoamyl group, 2-ethylhexyl group, 3,7-dimethyloctyl group, cyclohexyl group, 4-$C_1$ to $C_{12}$ alkylcyclohexyl group and the like. For enhancing the solubility of a polymeric fluorescent substance into a solvent, it is preferable that a cyclic or branched alkyl chain is contained in one or more substituents of $Ar_1$.

Also, the tips of two alkyl chains may be connected to form a ring. Further, a part of carbon atoms in an alkyl chain may be substituted with groups containing a hetero atom, and as the hetero atom, an oxygen atom, sulfur atom, nitrogen atom and the like are exemplified.

Moreover, in examples of R, when an aryl group or a heterocyclic compound group are contained as a part of the structure, these may further have one or more substituents.

In the above-mentioned formula (2), $X_1$ is a group of the above-mentioned formula (3). $X_1$ is connected with $Ar_2$ in the above-mentioned formula (2) to form one branching polymeric chain. A repeating unit of the above-mentioned formula (2) may be further contained in a branching polymeric chain, for re-branching. Though $X_1$ may be directly bonded to another repeating unit of the above-mentioned formula (2), it is preferable, for obtaining a polymer having high solubility, that a branch is separated from the subsequent branch by three or more repeating units.

Further, it is preferable that at least two of three or more polymeric-chain-forming substituents adjacent to $Ar_2$ (indicating $X_1$, —$(CR_3=CR_4)_m$— and the like in the above-mentioned formula (2)) are bonded at a conjugation-continuing position. Therefore, it is preferable that when any two atoms of atoms situated at a position bonded with adjacent main-chain-forming substituents is referred to as one pair, the number of atoms arranged along a ring between the above-mentioned two atoms in at least one or more pairs is even. For example, in the case of a benzene ring, bonds at 1, 3 and 4-positions, 1, 2, 4 and 5-positions, and the like are preferable not at 1, 3 and 5 positions.

In the above-mentioned formula (5), $X_2$ is a group of the above-mentioned formula (6). $X_2$ is connected with $Ar_6$ in the above-mentioned formula (5) to form one branching polymeric chain. A repeating unit of the above-mentioned formula (5) may be further contained in a branching polymeric chain, for re-branching. Though $X_2$ may be directly bonded to another repeating unit of the above-mentioned formula (5), it is preferable, for obtaining a polymer having high solubility, that a branch is separated from the subsequent branch by three or more repeating units.

Further, it is preferable that at least two of three or more polymeric-chain-forming substituents adjacent to $Ar_6$ (indicating $X_2$, $-(CR_{10}=CR_{11})_i-$ and the like in the above-mentioned formula (5)) are bonded at a conjugation-continuing position. Therefore, it is preferable that when any two atoms of atoms situated at a position bonded with adjacent polymeric-chain-forming substituents is referred to as one pair, the number of atoms arranged along a ring between the above-mentioned two atoms in at least one or more pairs is even.

Each of n in the formula (1), m in the formula (2), j, k in the formula (3), i in the formula (5), and f, g in the formula (6) independently represents 0 or 1. Each of $R_1$, $R_2$ in the formula (1), $R_3$, $R_4$ in the formula (2), $R_5$, $R_6$, $R_7$, $R_8$ in the formula (3), $R_9$ in the formula (4), $R_{10}$, $R_{11}$, in the formula (5), and $R_{12}$, $R_{13}$, $R_{14}$, $R_{15}$ in the formula (6) independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

When $R_1$ to $R_{15}$ each represent a substituent other than a hydrogen atom or cyano group, examples of the alkyl group having 1 to 20 carbon atoms include a methyl group, ethyl group, propyl group, butyl group, pentyl group, hexyl group, heptyl group, octyl group, nonyl group, decyl group, lauryl group and the like, and amethyl group, ethyl group, pentyl group, hexyl group, heptyl group and octyl group are preferable.

Examples of the aryl group having 6 to 60 carbon atoms include a phenyl group, $C_1$ to $C_{12}$ alkoxyphenyl group, $C_1$ to $C_{12}$ alkylphenyl group, 1-naphthyl group, 2-naphthyl group and the like, and a phenyl group and $C_1$ to $C_{12}$ alkylphenyl group are preferable.

Examples of the heterocyclic compound group having 4 to 60 carbon atoms include a thienyl group, $C_1$ to $C_{12}$ alkylthienyl group, pyrrolyl group, furyl group, pyridyl group, $C_1$ to $C_{12}$ alkylpyridyl group and the like, and a thienyl group, $C_1$ to $C_{12}$ alkylthienyl group, pyridyl group and $C_1$ to $C_{12}$ alkylpyridyl group are preferable.

Further, the terminal group of a polymeric fluorescent substance may also be protected with a stable group since if a active polymerizable group remains intact, there is a possibility of reductions in a light emitting property and life when the material is used in an device.

Those having a conjugated bond continued to the conjugated structure of the main chain are preferable, and there are exemplified structures containing a bond to an aryl group or a heterocyclic compound group via a vinylene group. Specifically, substituents described in JP-A No. 9-45478, chemical formula 10, and the like are exemplified.

This polymeric fluorescent substance may contain other repeating unit than the repeating unit of the formulae (1), (2),(4) or (5) in the range wherein luminescent property and charge transport property do not deteriorate. The repeating unit of the formulae (1),(2),(4),(5) or other unit than the repeating unit of the formulae (1),(2),(4) or (5) may be connected via a non-conjugated unit, or such non-conjugated part may also contained in the repeating unit. As the bonding structure, those shown in the following chemical formula 52, those obtained by combining those shown in the following chemical formula 52 with vinylene groups, those obtained by combining two or more shown in the following chemical formula 52, and the like are exemplified. Wherein, R is a group selected from the same substituents as described above, and Ar represents a hydrocarbon atom having 6 to 60 carbon atoms.

Chemical formula 52

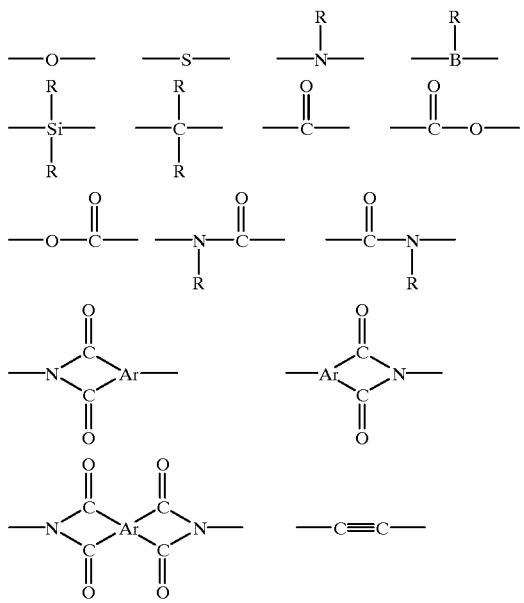

This polymeric fluorescent substance may also be a random, block or graft copolymer, or a polymer having an intermediate structure thereof, for example, a random copolymer having blocking property. From the view point for obtaining a polymeric fluorescent substance having high fluorescent quantum yield, random copolymers having blocking property and block or graft copolymers are more preferable than complete random copolymers.

However, it is preferable that the branching of the main chain has a structure of the above-mentioned formula (2), (4) or (5). Further, not a regularly grown dendrimer but a randomly branched structure is preferable.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $10^3$ to $10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

A polymeric fluorescent substance of the present invention has a branching polymeric chain, therefore, it may be advantageous that the total number of all repeating units also including those in the branched tip is within this range.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Then, a method for producing a polymeric fluorescent substance of the present invention will be described.

As the method for producing a polymeric fluorescent substance of the present invention, when the main chain has a vinylene group, there are exemplified methods described in JP-A No. 5-202355. Namely, a polymerization of a compound having an aldehyde group with a compound having a phosphonium salt group, or of a compound having an aldehyde group and phosphonium salt group according to Witting reaction, a polymerization of a compound having a vinyl group with a compound having a halogen group, or of a compound having a vinyl group and a halogen group according to Heck reaction, a polymerization of a compound having an aldehyde group with a compound having an alkylphosphonate group, or of a compound having an aldehyde group and an alkylphosphonate group according to Horner-Wadsworth-Emmons method, a polycondensation according to a de-hydrohalogenationg method of a compound having two or more halogenated methyl groups, a polycondensation according to a sulfonium salt decomposition method of a compound having two or more sulfonium salt groups, a polymerization of a compound having an aldehyde group with a compound having an acetonitrile group, or of a compound having an aldehyde group and an acetonitrile group according to Knoevenagel reaction, a polymerization according to McMurry reaction of a compound having two or more aldehyde groups, and the like.

Further, when the main chain does not have a vinylene group, there are exemplified a method in which polymerization is conducted from the corresponding monomer by the Suzuki coupling reaction, a method in which polymerization is conducted by the Grignard reaction, a method in which polymerization is conducted using a Ni(O) catalyst, a method in which polymerization is conducted using an oxidizing agents such as $FeCl_3$ and the like, a method in which oxidation polymerization is conducted electrochemically, a method in which an intermediate polymer having a suitable releasing group is decomposed, and the like.

Of them, a polymerization according to Witting reaction, a polymerization according to Heck reaction, a polymerization according to Horner-Wadsworth-Emmons method, a polymerization according to Knoeveragel method, a polymerization method according to Suzuki coupling reaction, a polymerization method according to Grignard method, and a polymerization method using a Ni (0) catalyst are preferable since structure control is easy.

A polymeric fluorescent substance of the present invention is obtained by the above-mentioned various methods, and particularly, can be easily obtained by the production methods [5] to [8] of the present invention.

The method for producing a polymeric fluorescent substance [5] is characterized in that it comprises reacting each one or more compounds of the above-mentioned formulae (7), (8) and (9) so that the amount of compounds of the formula (9) is in a range from 0.05 to 10 mol % based on the total amount of compounds of the formulae (7), (8) and (9).

When the amount of compounds of the above-mentioned formula (9) is less than 0.05 mol %, the effect of the present invention is not exerted, while when over 10 mol %, too many branches are present, causing gelling, and leading to difficult handling.

The degree of branching of the resulting polymeric fluorescent substance can be controlled by the amount and the magnitude of 'a' of a compound of the above-mentioned formula (9). When too many branches are present, a polymer in the form of a network tends to be formed and solubility thereof lowers, accordingly, when a is 5 or more, it is preferable that the amount of compounds of the above-mentioned formula (9) is from 0.05 to 3 mol %. Depending on the structure of a repeating unit, also when a is 4 or less, it is preferable that the amount of compounds of the above-mentioned formula (9) is from 0.05 to 3 mol %.

In the above-mentioned formulae (7), (8) and (9), $Ar_8$, $Ar_9$ and $Ar_{10}$ are a group which is converted, after polymerization, into an arylene group, heterocyclic compound group or, a group containing a metal complex having as a ligand an organic compound. $X_3$ and $X_4$ are reactive substituents which mutually react to form a carbon—carbon single bond or a structure of the above-mentioned formula (10).

The method for producing a polymeric fluorescent substance [6] is characterized in that it comprises reacting each one or more compounds of the above-mentioned formulae (11), (12) and (13) so that the amount of compounds of the formula (12) is in a range from 90 to 99.95 mol % based on the total amount of compounds of the formulae (11), (12) and (13).

Further, the method for producing a polymeric fluorescent substance [7] is characterized in that it comprises reacting each one or more compounds of the above-mentioned formulae (11) and (12) so that the amount of compounds of the formula (11) is in a range from 0.05 to 10 mol % based on the total amount of compounds of the formulae (11) and (12).

In the present invention [6] or [7], when the amount of compounds of the above-mentioned formula (12) is less than 90 mol %, too many branches are present, causing gelling, and leading to difficult handling, while when over 99.95 mol %, the effect of the present invention is not exerted.

The degree of branching of the resulting polymeric fluorescent substance can be controlled by the amount and the magnitude of 'b' of a compound of the above-mentioned formula (11) and by the amount and the magnitude of 'c' of a compound of the above-mentioned formula (13). This method is characteristic in that a polymer in the form of a network is not formed even if many branches are present, consequently, the method is preferable from the standpoint of maintenance of solubility. For providing suitable branching, it is more preferable the total amount of compounds of the above-mentioned formulae (11) and (13) is 95 to 98 mol %.

In the above-mentioned formulae (11), (12) and (13), $Ar_{11}$, $Ar_{12}$ and $Ar_{13}$ are a group which is converted, after polymerization, into an arylene group, a heterocyclic compound group or, a group containing a metal complex having as a ligand an organic compound. $X_5$ and $X_6$ are reactive substituents which mutually react to form a carbon—carbon single bond or a structure of the above-mentioned formula (10).

The method for producing a polymeric fluorescent substance [8] comprises reacting each one or more compounds of the formulae (14) and (15) with one or more compounds of the formulae (16), (17) and (18). The characteristic thereof is that the total amount of compounds of the formulae (14) and (15) is in a range from 0.05 to 10 mol % based on the total amount of compounds of the formulae (14), (15), (16), (17) and (18).

In the above-mentioned formulae (14), (15), (16), (17) and (18), $Ar_{14}$ to $Ar_{27}$ are a group which is converted, after polymerization, into an arylene group, a heterocyclic compound group or, a group containing a metal complex having as a ligand an organic compound. $X_7$ and $X_8$ are reactive substituents which mutually react to form a carbon—carbon single bond or a structure of the above-mentioned formula (10).

Each of $R_{16}$, $R_{17}$ in the above-mentioned formula (10), $R_{18}$ in the above-mentioned formula (16), and $R_{19}$ and $R_{20}$ in the above-mentioned formula (18) independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group, and the same examples as for the above-mentioned $R_1$ to $R_{15}$ can be used.

In the methods for producing a polymeric fluorescent substance [5] to [8], materials may be mixed in one time and reacted, or if necessary, may be divided and mixed.

Specific examples of combinations of $X_3$ and $X_4$, $X_5$ and $X_6$, or $X_7$ and $X_8$ in the methods for producing a polymeric fluorescent substance [5] to [8] include, but are not limited to, those shown in Table 1. XA and XB represent combinations of $X_3$ and $X_4$, $X_4$ and $X_3$, $X_5$ and $X_6$, $X_6$ and $X_5$, $X_7$ and $X_8$, $X_8$ and $X_7$. It may be advantageous to select one or more combinations of them.

A compound having these reactive substituents can be reacted, if necessary, under condition dissolved in an organic solvent, using for example an alkali or suitable catalyst, at temperatures from the melting point to the boiling point of the organic solvent. For example, there can be used known methods described in "Organic Reactions", 14, 270 to 490, John Wiley & Sons, Inc., 1965, "Organic Reactions", 27, 345 to 390, John Wiley & Sons, Inc., 1982", "Organic Syntheses", Collective Volume VI, 407 to 411, John Wiley & Sons, Inc., 1988, Chemical Review, 95, 2457 (1995), Journal of Organometallic Chemistry, 576, 147(1999), Journal of Practical Chemistry, 336,247(1994), Macromolecular Chemistry, Macromolecular Symposium, 12, 229 (1987), and the like.

Since an organic solvent depends on compounds and reactions used, it is preferable to perform de-oxygen treatment sufficiently on the solvent used and to progress the reaction under an inert atmosphere in order to suppress a side reaction generally. Likewise, it is preferable to effect de-hydration treatment (excluding cases of reactions in a two-phase system with water such as Suzuki coupling reaction.).

For reactions, an alkali or a suitable catalyst are properly added. These may advantageously be selected depending on the reaction used. This alkali or catalyst is preferably one which is dissolved sufficiently in a solvent used in the reaction. As the method for mixing an alkali or a catalyst, a method in which a solution of an alkali or a catalyst is added slowly to the reaction solution while stirring the reaction solution under an inert atmosphere such as argon and nitrogen, and a method in which the reaction solution is slowly added contrarily to the solution of an alkali or a catalyst, are exemplified.

Regarding more specific reaction conditions, in the case of Wittig reaction, Horner reaction, Knoevengel reaction and the like, an alkali is used in an amount of equivalent or more, preferably 1 to 3 equivalent based on functional groups of the monomer. The alkali is not particularly restricted, and for example, metal alcoholates such as potassium t-butoxide, sodium t-butoxide, sodium ethylate, lithium methylate and the like, hydride reagents such as sodium hydroxide and the like, amides such as sodiumamide and the like can be used. As the solvent, N,N-dimethylformamide, tetrahydrofuran, dioxane, toluene and the like are used. The reaction can be progressed usually at temperatures from room temperature to about 150° C. The reaction time is for example from 5 minutes to 40 hours, and may be that during which the polymerization progresses sufficiently, and since there is no necessity to leave the reaction mixture for a long period after completion of the reaction, the reaction time is preferably from 10 minutes to 24 hours. If the concentration in the reaction is too dilute, the efficiency of the reaction is poor, and if too dense, the control of the reaction is too difficult, consequently, the concentration may be appropriately selected in the range from about 0.01 wt % to the maximum soluble concentration, and is usually from 0.1 wt % to 20 wt %. In the case of Heck reaction, monomers are reacted in the presence of a base such as triethylamine and the like using a palladium catalyst. The reaction is effected using a solvent having relatively higher boiling point such as N,N-dimethylformamide, N-methylpyrrolidone and the like at a reaction temperature from about 80 to 160° C. for a reaction time from about 1 hour to 100 hours.

In the case of Suzuki coupling reaction, inorganic bases such as potassium carbonate, sodium carbonate, barium hydroxide and the like, organic bases such as triethylamine and the like, and inorganic salts such as cesium fluoride and the like are added in an amount of equivalent or more, preferably from 1 to 10 equivalents and allowed to react, using as a catalyst, for example, palladium[tetrakis (triphenylphosphine)], palladium acetates and the like. An inorganic salt may be reacted, as an aqueous solution, in a two-phase system. As the solvent, N,N-dimethylformamide, toluene, dimethoxyethane, tetrahydrofuran and the like are exemplified. Depending on the solvent, temperatures from about 50 to 160° C. are suitably used. The temperature may be raised to near the boiling point of the solvent to effect reflux. The reaction time is typically from 1 hour to 200 hours.

In the case of Grignard reaction, a method is exemplified in which a halide and metal Mg are reacted in an ether-based solvent such as tetrahydrofuran, diethyl ether, dimethoxyethane and the like to give a Grignard reagent solution which is mixed with a separately prepared monomer solution, a nickel or palladium catalyst is added to this while taking notice so as not to cause an excess reaction, then, the temperature is raised to effect the reaction under reflux. The Grignard reagent is used in an amount of equivalent or more, preferably from 1 to 1.5 equivalent, more preferably from 1 to 1.2 equivalent based on the monomers. Also when polymerization is conducted by other method than this, the reaction can be conducted according to a known method.

TABLE 1

| Reaction No. | —X_A | —X_B |
|---|---|---|
| 1 | —CHO | —CH$_2$—P$^+$(C$_6$H$_5$)$_3$ X$^-$ |
| 2 | —C(=O)R' | —CH$_2$—P$^+$(C$_6$H$_5$)$_3$ X$^-$ |
| 3 | —X | —CR'=CR'$_2$ |
| 4 | —CHO | —CH$_2$—P(=O)(OR")$_2$ |
| 5 | —C(=O)R' | —CH$_2$—P(=O)(OR")$_2$ |
| 6 | —CHO | —CH$_2$CN |
| 7 | —CHO | —CH(R')—CN |
| 8 | —C(=O)R' | —CH$_2$CN |
| 9 | —C(=O)R' | —CH(R')—CN |
| 10 | —CH$_3$ | —CH=N—(C$_6$H$_5$) |
| 11 | —X | —B(OR")$_2$ |
| 12 | —X | —MgX |

In the above, X represents Cl or Br. Each of R's independently represents a group selected from the group consisting of alkyl groups having 1 to 20 carbon atoms, aryl groups having 6 to 60 carbon atoms and heterocyclic compound groups having 4 to 60 carbon atoms. Each of R"s independently represents an alkyl group having 1 to 20 carbon atoms.

Depending on the mixing ratio and the degree of polymerization of monomers (compounds of the formulae (7) to (9), (11) to (13), (14) to (18)), there are sometimes formed molecules having no branching which may be used in production of a polymer LED without being separated.

A method for producing a polymeric fluorescent substance of the present invention and methods for producing a dendrimer which is an example of a polymer having branching conventionally known have a difference in that in the case of the dendrimer, the reaction is progressed stepwise while incorporating a lot of branching points to grow the molecule, while in the case of the method of the instant application, the reaction is progressed in one pot. Therefore, the reaction according to the present invention is easier and extremely advantageous from the industrial standpoint.

Next, the polymer LED of the present invention will be illustrated. The polymer LED of the present invention is a polymer LED comprising a pair of electrodes composed of an anode and a cathode at least one of which is transparent or semitransparent and a light emitting layer disposed between the electrodes, and a polymeric fluorescent substance of the present invention is contained in the light emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.

| | |
|---|---|
| a) | anode/light emitting layer/cathode |
| b) | anode/hole transporting layer/light emitting layer/cathode |
| c) | anode/light emitting layer/electron transporting layer/ /cathode |
| d) | anode/hole transporting layer/light emitting layer/electron transporting layer/cathode (wherein, / indicates adjacent lamination of layers. Hereinafter, the same) |

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode
t) anode/insulation layer having a thickness of 2 nm or less/hole transporting layer/light emitting layer/cathode
u) anode/hole transporting layer/light emitting layer/insulation layer having a thickness of 2 nm or less/cathode
v) anode/insulation layer having a thickness of 2 nm or less/hole transporting layer/light emitting layer/insulation layer having a thickness of 2 nm or less/cathode
w) anode/insulation layer having a thickness of 2 nm or less/light emitting layer/electron transporting layer/cathode
x) anode/light emitting layer/electron transporting layer/insulation layer having a thickness of 2 nm or less/cathode
y) anode/insulation layer having a thickness of 2 nm or less/light emitting layer/electron transporting layer/insulation layer having a thickness of 2 nm or less/cathode
z) anode/insulation layer having a thickness of 2 nm or less/hole transporting layer/light emitting layer/electron transporting layer/cathode
aa) anode/hole transporting layer/light emitting layer/electron transporting layer/insulation layer having a thickness of 2 nm or less/cathode
ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361,2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly (vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 µm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361,2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t- butylphenyl)-1,3,4-oxadiazole, benzoquinone, anthraquinone, tris(8-quinolinol) aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 $\mu$m, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO), indium.zinc.oxide and the like, which are metal oxide complexes, and gold, platinum, silver, copper and the like are used, and among them, ITO, indium zinc oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 $\mu$m, preferably from 20 nm to 1 $\mu$m, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 $\mu$m, preferably from 20 nm to 1 $\mu$m, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a polystyrene-reduced number-average molecular weight was measured by gel permeation chromatography (GPC) using chloroform as a solvent.

Example 1

<Synthesis of Polymeric Fluorescent Substance 1>

To a solution of 2-(3,7-dimethyloctyloxy)phenyl-1,4-xylylene-$\alpha,\alpha'$-bis(diethoxyphosphate) (330 mg, 0.54 mmol), 2-(2-ethylhexyloxy)-5-methoxy-1,4-xylylene-$\alpha,\alpha'$-bis(diethoxyphosphate) (55 mg, 0.10 mmol), 2-(3,7-dimethyloctyloxy)phenyl-terephthalaldehyde (250 mg, 0.68 mmol) and durene-$\alpha,\alpha',\alpha'',\alpha'''$-tetrakis(diethoxyphosphate) (14 mg, 0.021 mmol) in a dry tetrahydrofuran (10 ml) was added a solution of t-butoxypotassium in tetrahydrofuran (0.07 wt %, 2 ml) under room temperature while stirring. After stirring for 3 hours at room temperature, a solution of potassium t-butoxide in tetrahydrofuran (0.07 wt %, 2 ml) was added, and reacted further for 3 hours. The reaction mixture was poured into ion exchanged water (250 ml), and the deposited precipitate was filtrated off. The resulted precipitate was dissolved in tetrahydrofuran, and re-precipitated from methanol. The deposited precipitate was filtrated off, and dried under reduced pressure. This polymer is referred to as Polymeric fluorescent substance 1.

Polymeric fluorescent substance 1 had a polystyrene-reduced number-average molecular weight of $1.0 \times 10^4$ and a weight-average molecular weight of $1.0 \times 10^7$. Polymeric fluorescent substance 1 was soluble in chloroform.

<Evaluation of Fluorescent Property>

A 0.4 wt % solution of Polymeric fluorescent substance 1 in chloroform was spin-coated on a quartz plate to form a thin film of Polymeric fluorescent substance 1. The ultraviolet visible absorption spectrum and the fluorescent spectrum of this thin film were measured by using a ultraviolet visual absorption spectrophotometer (UV3500 manufactured by Hitachi, Ltd.) and a fluorescent spectrophotometer (850 manufactured by Hitachi, Ltd.), respectively. For calculation of the fluorescent intensity, a fluorescent spectrum when excited at 410 nm was used. The area of the fluorescent spectrum obtained by plotting against wave number drawn on the abscissa was divided by absorption at 410 nm to obtain a relative value of fluorescent intensity.

Polymeric fluorescent substance 1 had a fluorescent peak wavelength of 548 nm and a relative value of fluorescent intensity of 1.8.

<Production and Evaluation of Diode>

On a glass substrate on which an ITO film having a thickness of 150 nm was coated by a sputtering method, a film having a thickness of 50 nm was formed using a solution of poly(ethylenedioxythiophene)/polystyrenesulfonic acid (Baytron, manufactured by Beyer) by spin coating, and dried on a hot plate for 5 minutes at 120° C. Then, a film having a thickness of about 70 nm was formed thereon using a 0.5 wt % solution of Polymeric fluorescent substance 1 in chloroform by spin coating. Further, this was dried at 80° C. under reduced pressure for 1 hour, then, lithium fluoride was vapor-deposited at a thickness of 0.4 nm as a cathode buffer layer, calcium was vapor-deposited at a thickness of 25 nm as a cathode, and aluminum was vapor-deposited at a thickness of 40 nm, to produce a polymer LED. The degrees of vacuum in the vapor-deposition procedures were all 1 to $8 \times 10^{-6}$ Torr. By applying voltage to the resulted diode, El emission from Polymeric fluorescent substance 1 was obtained. The intensity of EL emission was approximately in proportion to the current density. The voltage at which the brilliance went over 100 cd/m$^2$ was about 3.1 V, and the emission efficiency was about 8.0 cd/A at the maximum.

Comparative Example 1

A polymer was obtained in the same manner as in Example 1 except that durene-$\alpha,\alpha',\alpha'',\alpha'''$-tetrakis(diethoxyphosphate) was not included. The resulted polymer is referred to as Polymeric fluorescent substance 2.

Polymeric fluorescent substance 2 had a polystyrene-reduced number-average molecular weight of $2.0 \times 10^3$ and a weight-average molecular weight of $4.7 \times 10^4$. Polymeric fluorescent substance 2 was soluble in chloroform.

<Evaluation of Fluorescent Property>

A relative value of fluorescent intensity of Polymeric fluorescent substance 2 was measured in the same manner as in Example 1.

Polymeric fluorescent substance 2 had a fluorescent peak wavelength of 552 nm and a relative value of fluorescent intensity of 0.8.

Example 2

A polymer was obtained in the same manner as in Example 1 except that mesitylene-$\alpha,\alpha',\alpha''$-tris(diethoxyphosphate) was used instead of durene-$\alpha,\alpha',\alpha'',\alpha'''$-tetrakis(diethoxyphosphate). The resulted polymer is referred to as Polymeric fluorescent substance 3.

Polymeric fluorescent substance 3 had a polystyrene-reduced number-average molecular weight of $2.3 \times 10^3$ and a weight-average molecular weight of $2.3 \times 10^5$. Polymeric fluorescent substance 3 was soluble in chloroform.

Example 3

9,9-dioctylfluorene-2,7-bis(ethylene boronate) 0.227 g(0.43 mmol), 2,7-dibromo-9,9-dioctylfluorene 0.212 g(0.39 mmol), 1,2,4,5-tetrabromobenzene 0.008 g(0.02 mmol) and aliquat 336 0.21 g were dissolved in toluene (10 ml). To this solution, 1.38 g of potassium carbonate water solution (1 mol/kg) was added. Then, after adding paradium tetrakis(triphenylphosphine) 0.002 g, the solution was heated to reflux for 10 hours. Organic solvent portion was poured into methanol/water (=10/1), and deposited precipitate was filtrated off. The resulted precipitate was dissolved in toluene, and re-precipitated from methanol. The deposited precipitate was filtrated off, and dried under reduced pressre. This polymer is referred to as polymeric fluorescent subsrance 4.

Polymeric fluorescent substance 4 had a polystyrene-reduced number-average molecular weight of $1.9 \times 10^4$, and a weight-average molecular weight of $5.5 \times 10^5$. Polymeric fluorescent substance 4 was soluble in chloroform.

Example 4

A polymer was obtained in the same manner as in Example 3 except that the compound represented by chemical formula 53 below was used instead of 1,2,4,5-tetrabromobenzene. The resulted polymer is referred to as Polymeric fluorescent substance 5.

Polymeric fluorescent substance 5 had a polystyrene-reduced number-average molecular weight of $7.3 \times 10^3$ and a weight-average molecular weight of $3.4 \times 10^4$. Polymeric fluorescent substance 5 was soluble in chloroform.

Chemical formula 53

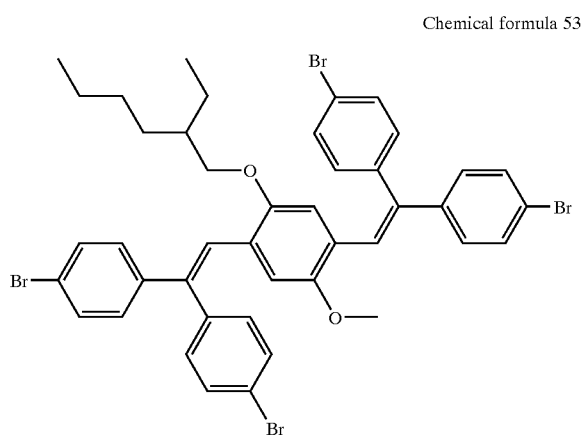

Comparative Example 2

A polymer was obtaine in the same manner as in Example 3 except that 1,2,4,5-tetrabromobenzene was not included. The resulted polymer is referred to as polymeric fluorescent substance 6.

Polymeric fluorescent substance 6 had a polystyrene-reduced number-average molecular weight of $1.3 \times 10^4$ and a weight-average molecular weight of $1.7 \times 10^4$. Polymeric fluorescent substance 6 was soluble in chloroform.

Example 5
<Synthesis of 2-(bromophenyl)pyridine>

2-Phenylpyridine 3 g(19.3 mmol) and iron powder 40 mg(0.716 mmol) were mixed and stirred. Bromine 4.0 g (25 mmol) was added dropwise with stirring at 0° C., avoiding the rising temperature. Then the mixture was heated up to 90° C. and keep the temperature for ten hours with stirring. After the completion of the reaction, this reaction mixture was dissolved into chloroform solution and washed with 5% aqueous sodium thiosulfate solution. After dried by sodium sulufate, the organic solution was concentrated by an evaporator. The residue obtainedwas purifiedbyuse of silica gel column chromatography. 1.6 g (6.83 mmol) of 2-(bromophenyl)pyridine was obtained and the yield was 35.4%. Analysis: $M^+=234.0$ By FD-MS.
<Production of Tris(2-(bromophenyl)pyridine)iridium(III)>

Tris(acetylacetonate)iridium(III) complex 50 mg(0.1021 mmol), 2-(bromophenyl) pyridine 95.6 mg(0.4084 mmol) and glycol 20 ml were mixed in a 50 ml reaction vessel. The mixture was stirred and maintained at reflux for ten hours. After the reaction, 100 ml of 1N aqueous hydrochloric acid solution was added and stirred for 30 minutes. The precipitate was filtered and dissolved into least amount of ethylene dichloride solvent. Thus obtained solution was filtered by silica gel column chromatography for the removal of insoluble byproducts. Addition of methanol to the chromatographed solution followed by heating to evaporate dichloromethane, resulted in precipitation The yellow product was obtained by filtration.

The obtained product was Tris(2-(bromophenyl)pyridine) iridium(III) 10.12 mg (0.0113 mmol). The yield was 11.1%. Analysis: $M^+=893.0$ By FD-MS.
<Synthesis of Bis (2-(phenyl)pyridine)mono(2-(bromophenyl)pyridine) iridium(III)>

Tris(acetylacetonate)iridium(III) complex 0.642 g(1.31 mmol), 2-(bromophenyl) pyridine 0.41 g(1.75 mmol), 2-(phenyl)pyridine 0.54 g(3.5 mmol) and glycol 50 ml were mixed and stirred. The mixture was heated to and maintained at reflux for ten hours. After the reaction, 100 ml of 1N aqueous hydrochloric acid solution was added and stirred for 30 minutes. The precipitated was filtered and solved into least amount of ethylene dichloride solvent. Thus obtained solution was filtered by silica gel column chromatography for the removal of insoluble byproducts. Addition of methanol to the chromatographed solution followed by heating to evaporate dichloromethane, resulted in precipitation. The yellow product was obtained by filtration. 0.13 g(0.177 mmol) of the products mixture was obtained. In the product mixture bis(2-(phenyl)pyridine)mono(2-(bromophenyl)pyridine)iridiu m(III) was mainly contained. Yield was 13.5%. By FD-MS analysis, main signal($M^+$) was at 733.0.

In this products mixture, tris(2-(bromophenyl)pyridine) iridium(III) (complex 1), mono(2-(phenyl)pyridine)bis(2-(bromophenyl)pyridine)iridium(III) (complex 2), bis(2-(phenyl)pyridine)mono(2-bromophenyl)pyridine)iridium (III) (complex 3) and tris(2-(phenyl)pyridine) iridium(III) (complex 4) are contained. The ratio of four complexes was obtained by FD-MS analysis, shown in table 2. Among those complexes, only complex 4 will form a repeating unit which contained a branched structure.

TABLE 2

| | Peak content Ratio (%) | notes |
|---|---|---|
| Complex 1 | 31 12.2 | non-reactive, removed during reaction |
| Complex 2 | 86 33.7 | attached at a terminal of a polymer |
| Complex 3 | 100 39.2 | introduced into the main chain of a polymer |
| Complex 4 | 38 14.9 | will form a branched structure |

<Synthesis of Polymeric Fluorescent Substance 7>

9,9-dioctyl-2,7-dibromofluorene 0.403 g(0.735 mmol), N-octyl-3,6-dibromocarbazole 0.321 g(0.735 mmol), bis(2-(phenyl)pyridine)mono(2-(bromophenyl)pyridine) iridium (III)0.022 g (0.03 mmol, in fact this compound is the mixture of tris(2-(bromophenyl)pyridine) iridium(III), mono (2-(phenyl)pyridine)bis(2-(bromo phenyl)pyridine)iridium (III), tris(2-(phenyl)pyridine) iridium(III), and bis(2-(phenyl) pyridine)mono (2-(bromophenyl) pyridine) iridium (III), for the calculation of molecular weight, $M^+ = 733.0$ of bis(2-(phenyl)pyridine)mono (2-(bromophenyl)pyridine) iridium(III) was used) and 2,2'-bipyridyl 0.55 g(3.5 mmol) were mixed into the reaction vessel. The mixture was stirred under nitrogen for 1 hour. 40 ml of tetrahydrofuran (dehydrated) degassed by bubbling with argon was added. After stirring for 30 minutes, bis(1,5-cyclooctadiene)nickel (0) 0.96 g(3.5 mmol) was added. The solution was stirred under nitrogen at room temperature for ten minutes, and heated to 60° C., maintained at the temperature for 8 hours. After the completion of the reaction, the mixture was allowed to cool to room temperature and poured into the stirring mixed solvent of 25% aqueous ammonia solution 10 ml/methanol 150 ml/distilled water 50 ml. The solution was stirred for 30 minutes. The precipitate was filtered. After dring up the product, dissolved into chloroform and filtered to remove the insoluble residue. This solvent was poured into methanol to precipitate the polymer. The polymer isolated by filtration was dried up under reduced pressure and 0.11 g of polymer was obtained. Thus produced polymer was named as polymeric fluorescent substance 7 (Mw: $4.4 \times 10^5$, Mn:$1.9 \times 10^5$). The polymeric fluorescent substance 7 obtained is a copolymer, which has such repeating units as 9,9-dioctyl-2,7-fluorene, N-octyl-3,6-carbazole and tris(2-(phenyl) pyridine) iridium (III). Calculating from the ratio of monomers used, tris(2-(phenyl)pyridine) iridium (III) is contained by about 0.3 mol %, based on the total amount of the repeating units in the polymer structure.

Example 6

<Synthesis of Polymeric Fluorescent Substance 8>

9,9-dioctyl-2,7-dibromofluorene 0.403 g(0.735 mmol), N,N'-diphenyl-N,N'-bis(3-methyl-4-bromophenyl) benzidine 0.496 g(0.735 mmol), bis(2-(phenyl)pyridine) mono(2-(bromo phenyl)pyridine) iridium (III) 0.022 g(0.03 mmol, in fact this compound is the mixture of tris(2-(bromophenyl)pyridine) iridium(III), mono(2-(phenyl) pyridine)bis(2-(bromo phenyl)pyridine)iridium(III), tris(2-(phenyl)pyridine) iridium(III), and bis(2-(phenyl)pyridine) mono(2-(bromophenyl)pyridine) iridium(III), for the calculation of molecular weight, $M^+ = 733.0$ of bis(2-(phenyl)pyridine)mono (2-(bromophenyl)pyridine) iridium (III) was used) and 2,2'-bipyridyl 0.55 g(3.5 mmol) were mixed into the reaction vessel. The mixture was stirred under nitrogen for 1 hour. 40 ml of tetrahydrofuran (dehydrated) degassed by bubbling with argon was added. After stirring for 30 minutes, bis(1,5-cyclooctadiene)nickel (0) 0.96 g(3.5 mmol) was added. The solution was stirred under nitrogen gas at room temperature for ten minutes, and heated to 60° C., maintained at the temperature for 8 hours. After the completion of the reaction, the mixture was allowed to cool to room temperature and poured into the stirring mixed solvent of 25% aqueous ammonia solution 10 ml/methanol 150 ml/distilled water 50 ml. The solution was stirred for 30 minutes. The precipitate was filtered. After dring up the product, dissolved into chloroform and filtered to remove the insoluble residue. This solvent was poured into methanol to precipitate the polymer. The polymer isolated by filtration was dried up under reduced pressure and 0.11 g of polymer was obtained. Thus produced polymer was named as polymeric fluorescent substance 8 (Mw:$3.6 \times 10^5$, Mn:$1.8 \times 10^4$). The polymeric fluorescent substance 8 obtained is a copolymer, which has such repeating units as 9,9-dioctyl-2,7-fluorene, N,N'-diphenyl-N,N'-bis(3-methylphenyl) benzidine and tris (2-(phenyl) pyridine) iridium (III). Calculating from the ratio of monomers used, tris(2-(phenyl)pyridine) iridium (III) is contained by about 0.3 mol %, based on the total amount of the repeating units in the polymer structure.

Example 7

<Synthesis of Polymeric Fluorescent Substance 9>

9,9-dioctyl-2,7-dibromofluorene 0.806 g(0.735 mmol), bis(2-(phenyl)pyridine)mono(2-(bromophenyl)pyridine) iridium (III) 0.022 g (0.03 mmol, in fact this compound is the mixture of tris(2-(bromophenyl)pyridine) iridium(III), mono (2-(phenyl)pyridine) bis(2-(bromophenyl)pyridine)iridium (III), tris(2-(phenyl)pyridine) iridium(III), and bis(2-(phenyl)pyridine)mono(2-(bromophenyl)pyridine) iridium (III), for the calculation of molecular weight, $M^+ = 733.0$ of bis(2-(phenyl)pyridine)mono (2-(bromophenyl)pyridine) iridium(III) was used) and 2,2'-bipyridyl 0.55 g(3.5 mmol) were mixed into the reaction vessel. The mixture was stirred under nitrogen for 1 hour. 40 ml of tetrahydrofuran (dehydrated) degassed and bubbling with argon was added. After stirring for 30 minutes, bis(1,5-cyclooctadiene)nickel (0) 0.96 g(3.5 mmol) was added. The solution was stirred under nitrogen at room temperature for ten minutes, and heated to 60° C., maintained at the temperature for 8 hours. After the completion of the reaction, the mixture was allowed to cool to room temperature and poured into the stirring mixed solvent of 25% aqueous ammonia solution 10 ml/methanol 150 ml/distilled water 50 ml. The solution was stirred for 30 minutes. The precipitate was filtered. After drying up the product, dissolved into chloroform and filtered to remove the insoluble residue. This solvent was poured into methanol to precipitate the polymer. The polymer isolated by filtration was dried up under reduced pressure and 0.11 g of polymer was obtained. Thus produced polymer was named as polymeric fluorescent substance 9 (Mw: $7.6 \times 10^5$, Mn:$1.2 \times 10^4$). The polymeric fluorescent substance 9 obtained is a copolymer, which has such repeating units as 9,9-dioctyl-2,7-fluorene, and tris(2-(phenyl) pyridine) iridium (III). Calculating from the ratio of monomers used, tris(2-(phenyl)pyridine) iridium (III) is contained by about 0.3 mol %, based on the total amount of the repeating units in the polymer structure.

A polymeric fluorescent substance of the present invention is excellent in solubility and film-forming ability, and can be suitably used as a light emitting material of a polymer LED and the like. Further, according to a production method of the present invention, this polymeric fluorescent substance can be easily produced. Moreover, a polymer LED obtained by using this polymeric fluorescent substance manifests high emission efficiency.

What is claimed is:

1. A polymeric fluorescent substance which emits fluorescence in solid state, has a polystyrene-reduced number-average molecular weight of $10^3$ to $10^8$ and contains one or more repeating units represented by the following formula (1) in main chain, wherein 0.05 to 10 mol % repeating units of all repeating units contained in the polymeric fluorescent substance have branching polymeric chains:

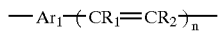  (1)

in the formula, $Ar_1$ is a group selected from the group consisting of an arylene group having 6 to 60 carbon atoms, a heterocyclic compound group having 4 to 60 carbon atoms and a group containing a metal complex having, as a ligand, one or more organic compounds containing 4 to 60 carbon atoms; $Ar_1$ may have one or more substituents; each of $R_1$ and $R_2$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and n is 0 or 1.

2. The polymeric fluorescent substance according to claim 1, wherein the substances contains each one or more of repeating units represented by the formula (1) and the following formula (2) in main chain, and the total amount of these repeating units is 50 mol % or more based on the amount of all repeating units, the amount of repeating units of the formula (2) is 0.1 to 10 mol % based on the total amount of repeating units of the formulae (1) and (2), and the substance has a polymeric chain which is branched at a repeating unit of the formula (2) as a branching point:

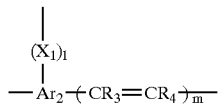  (2)

in the formula, $Ar_2$ is an arylene group having 6 to 60 carbon atoms or a heterocyclic compound group having 4 to 60 carbon atoms; $X_1$ is a group of the following formula (3), and constitutes apart of the main chain; the symbol "1" is an integer of 1 to 4, $Ar_2$ may further have one or more substituents; when $Ar_2$ has a plurality of substituents, they may be the same or different; each of $R_3$ and $R_4$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and m is 0 or 1:

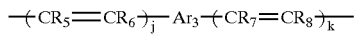  (3)

in the formula, $Ar_3$ is an arylene group having 6 to 60 carbon atoms or a heterocyclic compound group having 4 to 60 carbon atoms; $Ar_3$ may have one or more substituents; each of $R_5$, $R_6$, $R_7$ and $R_8$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and each of j and k is independently 0 or 1.

3. The polymeric fluorescent substance according to claim 1, wherein the substance contains each one or more of repeating units of said formula (1) and the following formula (4) in main chain, and the total amount of these repeating units is 50 mol % or more based on the amount of all repeating units, the amount of repeating units of the formula (4) is 0.1 to 10 mol % based on the total amount of repeating units of the formulae (1) and (4), and the substance has a polymeric chain which is branched at a repeating unit of the formula (4) as a branching point,

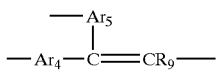  (4)

in the formula, $Ar_4$ and $Ar_5$ are an arylene group having 6 to 60 carbon atoms or a heterocyclic compound group having 4 to 60 carbon atoms; $Ar_4$ and $Ar_5$ may have one or more substituents, $R_9$ represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

4. The polymeric fluorescent substance according to claim 1, wherein the substance contains each one or more of repeating units of said formula (1) and the following formula (5) in main chain, and the total amount of these repeating units is 50 molt or more based on the amount of all repeating units, the amount of repeating units of the formula (5) is 0.1 to 10 molt based on the total amount of repeating units of the formulae (1) and (5), and the substance has a polymeric chain which is branched at a repeating unit of the formula (5) as a branching point,

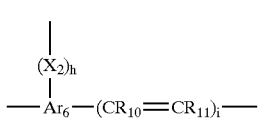  (5)

in the formula, $Ar_6$ is a group containing a metal complex having as a ligand an organic compound containing 4 to 60 carbon atoms; said metal complex has two or more ligands connected with the adjacent repeating units, and constitutes a branching point being connected with three or more adjacent repeating units as the whole metal complex; $X_2$ is agroup of the following formula (6), and constitutes a part of the polymeric chain; h is an integer of 1 to 4; $Ar_6$ may further have one or more substituents; when $Ar_6$ has a plurality of substituents, they may be the same or different; each of $R_{10}$ and $R_{11}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and i is 0 or 1:

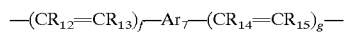  (6)

in the formula, $Ar_7$ is an arylene group having 6 to 60 carbon atoms contained in the polymeric chain or a heterocyclic compound group having 4 to 60 carbon atoms contained in the polymeric chain; $Ar_7$ may have one or more substituents; each of $R_{12}$, $R_{13}$, $R_{14}$ and $R_{15}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group; and each of g and f is independently 0 or 1.

5. A method for producing the polymeric fluorescent substance of claim 1, 2 or 4, which comprises reacting each one or more compounds of the following formulae (7), (8) and (9) so that the amount of compounds of the following formula (9) is in a range from 0.05 to 10 molt based on the total amount of compounds of the following formulae (7), (8) and (9):

  (7)

 (8)

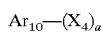 (9)

in the formulae, each of $Ar_8$ to $Ar_{10}$ independently represents a group selected from the group consisting of aromatic hydrocarbon groups having 6 to 60 carbon atoms, heterocyclic compound groups having 4 to 60 carbon atoms and groups containing a metal complex having as a ligand an organic compound containing 4 to 60 carbon atoms; $Ar_8$ to $Ar_{10}$ may have one or more substituents; $X_3$ and $X_4$ are reactive substituents which mutually react to form a carbon—carbon single bond or a structure of the following formula (10); $X_3$ and $X_4$ represent different groups from each other; and a represents an integer of 3 to 6:

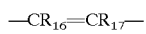 (10)

in the formula, each of $R_{16}$ and $R_{17}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

6. A method for producing the polymeric fluorescent substance of claim 1, 2 or 4, which comprises reacting each one or more compounds of the following formulae (11), (12) and (13) so that the amount of compounds of the following formula (12) is in a range from 90 to 99.95 mol % based on the total amount of compounds of the following formulae (11), (12) and (13):

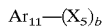 (11)

 (12)

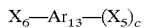 (13)

in the formulae, each of $Ar_{11}$ to $Ar_{13}$ independently represents agroup selected from the group consisting of aromatic hydrocarbon groups having 6 to 60 carbon atoms, heterocyclic compound groups having 4 to 60 carbon atoms and groups containing a metal complex having as a ligand an organic compound containing 4 to 60 carbon atoms; each of $Ar_{11}$ to $Ar_{13}$ independently may have substituents; $X_5$ and $X_6$ are reactive substituents which mutually react to form a carbon—carbon single bond or a structure of said formula (10); $X_5$ and $X_6$ represent different groups from each other; b represents an integer of 3 to 6; and c represents an integer of 2 to 5.

7. A method for producing the polymeric fluorescent substance of claim 1, 2 or 4, which comprises reacting each one or more compounds of said formulae (11) and (12) so that the amount of compounds of the formula (11) is in a range from 0.05 to 10 molt based on the total amount of compounds of the formulae (11) and (12).

8. A method for producing the polymeric fluorescent substance of claim 1 or 3, which comprises reacting each one or more compounds of the following formulae (14) and (15) with one or more compounds of the following formulae (16), (17) and (18) to obtain a polymeric fluorescent substance so that the total amount of compounds of the following formulae (14) and (15) is in a range from 0.05 to 10 mol % based on the total amount of compounds of the following formulae (14), (15), (16), (17) and (18):

 (14)

 (15)

 (16)

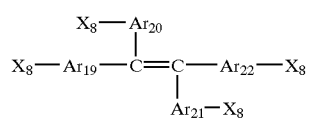 (17)

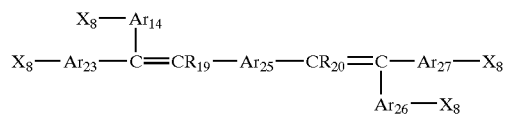 (18)

in the formulae, each of $Ar_{14}$ to $Ar_{27}$ independently represents a group selected from the group consisting of aromatic hydrocarbon groups having 6 to 60 carbon atoms, heterocyclic compound groups having 4 to 60 carbon atoms and groups containing a metal complex having as a ligand an organic compound containing 4 to 60 carbon atoms; each of $Ar_{14}$ to $Ar_{27}$ independently may have one or more substituents; $X_7$ and $X_8$ are reactive substituents which mutually react to form a carbon—carbon single bond or a structure of said formula (10); $X_7$ and $X_8$ represent different groups from each other; and each of $R_{18}$ to $R_{20}$ independently represents a group selected from the group consisting of a hydrogen atom, alkyl groups having 1 to 20 carbon atoms, aryl groups having 6 to 60 carbon atoms, heterocyclic compound groups having 4 to 60 carbon atoms and a cyano group.

9. A polymer light emitting device comprising a pair of electrodes composed of an anode and a cathode at least one of which is transparent or semitransparent and at least one light emitting layer disposed between the electrodes, wherein the polymeric fluorescent substance of any of claims 1 to 4 is contained in said light emitting layer.

10. The polymer light emitting device according to claim 9 wherein a layer containing an conducting polymer is disposed at least between one electrode and the light emitting layer so that the layer containing a conducting polymer is adjacent to said electrode.

11. The polymer light emitting device according to claim 9 wherein an insulation layer having a thickness of 2 nm or less is disposed at least between one electrode and the light emitting layer so that the insulation layer is adjacent to said electrode.

12. The polymer light emitting device according to claim 9 wherein a layer comprising an electron transporting compound is disposed between the cathode and the light emitting layer so that the layer comprising an electron transporting compound is adjacent to said light emitting layer.

13. The polymer light emitting device according to claim 9 wherein a layer comprising a hole transporting compound is disposed between the anode and the light emitting layer so that the layer comprising a hole transporting compound is adjacent to said light emitting layer.

14. The polymer light emitting device according to claim 9 wherein a layer comprising an electron transporting compound is disposed between the cathode and the light emitting layer so that the layer comprising an electron transporting compound is adjacent to said light emitting layer, and a layer comprising a hole transporting compound is disposed between the anode and the light emitting layer so that the layer comprising a hole transporting compound is adjacent to said light emitting layer.

15. A flat light source obtained by using the polymer light emitting device of claim 9.

16. A segment display obtained by using the polymer light emitting device of claim 9.

17. A dot matrix display obtained by using the polymer light emitting device of claim 9.

18. A liquid crystal display obtained by using the polymer light emitting device of claim 9 as a back-light.

19. The polymer light emitting device according to claim 10, wherein a layer comprising an electron transporting compound is disposed between the cathode and the light emitting layer so that the layer comprising an electron transporting compound is adjacent to said light emitting layer.

20. The polymer light emitting device according to claim 11, wherein a layer comprising an electron transporting compound is disposed between the cathode and the light emitting layer so that the layer comprising an electron transporting compound is adjacent to said light emitting layer.

21. The polymer light emitting device according to claim 10, wherein a layer comprising a hole transporting compound is disposed between the anode and the light emitting layer so that the layer comprising a hole transporting compound is adjacent to said light emitting layer.

22. The polymer light emitting device according to claim 11, wherein a layer comprising a hole transporting compound is disposed between the anode and the light emitting layer so that the layer comprising a hole transporting compound is adjacent to said light emitting layer.

23. The polymer light emitting device according to claim 10, wherein a layer comprising an electron transporting compound is disposed between the cathode and the light emitting layer so that the layer comprising an electron transporting compound is adjacent to said light emitting layer, and a layer comprising a hole transporting compound is disposed between the anode and the light emitting layer so that the layer comprising a hole transporting compound is adjacent to said light emitting layer.

24. The polymer light emitting device according to claim 11, wherein a layer comprising an electron transporting compound is disposed between the cathode and the light emitting layer so that the layer comprising an electron transporting compound is adjacent to said light emitting layer, and a layer comprising a hole transporting compound is disposed between the anode and the light emitting layer so that the layer comprising a hole transporting compound is adjacent to said light emitting layer.

25. A flat light source obtained by using the polymer light emitting device of claim 10.

26. A flat light source obtained by using the polymer light emitting device of claim 11.

27. A flat light source obtained by using the polymer light emitting device of claim 12.

28. A flat light source obtained by using the polymer light emitting device of claim 13.

29. A flat light source obtained by using the polymer light emitting device of claim 14.

30. A segment display obtained by using the polymer light emitting device of claim 10.

31. A segment display obtained by using the polymer light emitting device of claim 11.

32. A segment display obtained by using the polymer light emitting device of claim 12.

33. A segment display obtained by using the polymer light emitting device of claim 13.

34. A segment display obtained by using the polymer light emitting device of claim 14.

35. A dot matrix display obtained by using the polymer light emitting device of claim 10.

36. A dot matrix display obtained by using the polymer light emitting device of claim 11.

37. A dot matrix display obtained by using the polymer light emitting device of claim 12.

38. A dot matrix display obtained by using the polymer light emitting device of claim 13.

39. A dot matrix display obtained by using the polymer light emitting device of claim 14.

40. A liquid crystal display obtained by using the polymer light emitting device of claim 10.

41. A liquid crystal display obtained by using the polymer light emitting device of claim 11.

42. A liquid crystal display obtained by using the polymer light emitting device of claim 12.

43. A liquid crystal display obtained by using the polymer light emitting device of claim 13.

44. A liquid crystal display obtained by using the polymer light emitting device of claim 14.

* * * * *